(12) United States Patent
Myung

(10) Patent No.: US 11,657,206 B1
(45) Date of Patent: May 23, 2023

(54) METHOD FOR SEMICONDUCTOR DESIGN BASED ON ARTIFICIAL INTELLIGENCE

(71) Applicant: MakinaRocks Co., Ltd., Seoul (KR)

(72) Inventor: Wooshik Myung, Seoul (KR)

(73) Assignee: MakinaRocks Co., Ltd., Seoul (KR)

(*) Notice: Subject to any disclaimer, the term of this patent is extended or adjusted under 35 U.S.C. 154(b) by 0 days.

(21) Appl. No.: 18/154,340

(22) Filed: Jan. 13, 2023

(30) Foreign Application Priority Data

| Feb. 17, 2022 | (KR) | 10-2022-0020804 |
| Aug. 3, 2022 | (KR) | 10-2022-0096854 |

(51) Int. Cl.
| *G06F 30/39* | (2020.01) |
| *G06F 30/392* | (2020.01) |
| *G06N 3/0464* | (2023.01) |
| *G06N 3/092* | (2023.01) |

(52) U.S. Cl.
CPC ......... *G06F 30/392* (2020.01); *G06N 3/0464* (2023.01); *G06N 3/092* (2023.01)

(58) Field of Classification Search
CPC ........ G06F 30/392; G06F 30/27; G06F 30/30; G06N 3/0464; G06N 3/092; G06N 3/02; G06N 3/08
USPC ...................................................... 716/119
See application file for complete search history.

(56) References Cited

U.S. PATENT DOCUMENTS

| 5,926,396 | A | 7/1999 | Ohara |
| 8,108,819 | B2 | 1/2012 | Alpert et al. |
| 9,984,191 | B2 | 5/2018 | Hsieh et al. |
| 10,552,566 | B2 | 2/2020 | Park et al. |
| 2007/0186201 | A1 | 8/2007 | Itoh et al. |
| 2010/0306725 | A1 | 12/2010 | Kawasaki |
| 2022/0198111 | A1 | 6/2022 | Huh et al. |
| 2022/0340130 | A1 | 10/2022 | Motoyama |
| 2023/0065725 | A1* | 3/2023 | Badaroglu ........... G06N 3/0464 |

FOREIGN PATENT DOCUMENTS

| JP | 2001308190 A | 11/2001 |
| JP | 2007193671 A | 8/2007 |
| JP | 2010277230 A | 12/2010 |
| JP | 2013149308 A | 8/2013 |
| JP | 2019021123 A | 2/2019 |
| KR | 100296183 B1 | 10/2001 |
| KR | 101730692 B1 | 4/2017 |
| KR | 1020180035526 A | 4/2018 |
| KR | 1020200099252 A | 8/2020 |
| KR | 1020220020804 A | 2/2022 |

OTHER PUBLICATIONS

Korea Patent Office, Office Action, dated Mar. 28, 2022.

* cited by examiner

*Primary Examiner* — Paul Dinh
(74) *Attorney, Agent, or Firm* — Umberg Zipser LLP; Ryan Dean

(57) ABSTRACT

Disclosed is an artificial intelligence-based semiconductor design method performed by a computing device. The artificial intelligence-based semiconductor design method includes: inputting state map information related to a connection relationship between semiconductor devices to a Convolutional Neural Network (CNN) of a semiconductor placement model; placing the semiconductor device based on an output of the convolutional neural network; and training the semiconductor placement model based on the placement of the semiconductor devices.

8 Claims, 21 Drawing Sheets

FIG.5

|        | Net_0 | Net_1 | Net_2 | Net_3 |
|--------|-------|-------|-------|-------|
| Cell_0 | 1     | 0     | 1     | 1     |
| Cell_1 | 1     | 1     | 1     | 0     |
| Cell_2 | 1     | 1     | 0     | 1     |

FIG.7

|        | Cell_0 | Cell_1 | Cell_2 |
|--------|--------|--------|--------|
| Cell_0 | 0      | 2      | 2      |
| Cell_1 | 2      | 0      | 2      |
| Cell_2 | 2      | 2      | 0      |

(a)

|        | Cell_0 | Cell_1 | Cell_2 |
|--------|--------|--------|--------|
| Cell_0 | 0      | 1      | 1      |
| Cell_1 | 1      | 0      | 1      |
| Cell_2 | 1      | 1      | 0      |

(b)

| 0.0 | 0.0 | 0.0 | 0.0 | 0.0 |
|-----|-----|-----|-----|-----|
| 0.0 | 1.0 | 0.0 | 1.0 | 0.0 |
| 0.0 | 0.0 | 0.0 | 0.0 | 0.0 |
| 0.0 | 0.0 | 0.0 | 0.0 | 0.0 |
| 0.0 | 0.0 | 0.0 | 0.0 | 0.0 |

| 0.0 | 0.0 | 0.0 | 0.0 | 0.0 |
|---|---|---|---|---|
| 0.0 | 2.0 | 1.0 | 2.0 | 0.0 |
| 0.0 | 0.0 | 0.0 | 0.0 | 0.0 |
| 0.0 | 0.0 | 0.0 | 0.0 | 0.0 |
| 0.0 | 0.0 | 0.0 | 0.0 | 0.0 |

[Grid Cell (0, 1) BASED]

Horizontal Demand 1.0    Horizontal Demand 0.5    Horizontal Demand 0.5
                         Vertical Demand 0.5      Vertical Demand 0.5

| | 4/12 | |
|---|---|---|
| | | |
| | | |

62

| | 2/12 | |
|---|---|---|
| | | |
| | | |

FIG.15

| | 61 | | | | 62 | |
|---|---|---|---|---|---|---|
| | 4/12 | | | | 2/12 | |
| | 4/12 | | | | 4/12 | |
| | | | | | | |

FIG.16

| 61 | | |
|---|---|---|
| 3/12 | 4/12 | 1/12 |
| 2/12 | 4/12 | 2/12 |
| 1/12 | 4/12 | 3/12 |

| 62 | | |
|---|---|---|
| 3/12 | 2/12 | 1/12 |
| 4/12 | 4/12 | 4/12 |
| 1/12 | 2/12 | 3/12 |

FIG.17

METHOD FOR SEMICONDUCTOR DESIGN BASED ON ARTIFICIAL INTELLIGENCE

CROSS-REFERENCE TO RELATED APPLICATIONS

This application claims priority to and the benefit of Korean Patent Application No. 10-2022-0020804 filed in the Korean Intellectual Property Office on Feb. 17, 2022, the entire contents of which are incorporated herein by reference.

TECHNICAL FIELD

The present disclosure relates to a semiconductor design method, and more particularly, to an artificial intelligence technology for solving and optimizing problems generated in a semiconductor design process.

This study was conducted as part of the private intelligence information service expansion project of the Ministry of Science and ICT and the National IT Industry Promotion Agency (A0903-21-1021, AI-based semiconductor design automation system development).

BACKGROUND ART

In spite of technological advances, it is a reality that engineers directly perform logical design of semiconductors, which can be regarded as an aggregate of high-tech industries, by using rule-based software. Therefore, the logical design of a semiconductor cannot help but be performed based on an engineer's experience, and the design speed is inevitably different according to the skill level of an engineer. In addition, it is realistically very difficult for an engineer to efficiently place tens to millions of semiconductor devices in consideration of the connection relationship of the semiconductor devices. That is, since the current semiconductor design process depends on the experience and intuition of an engineer, it is difficult to maintain consistent design quality, and considerable time and money are required for the investment for design.

Korean Patent No. 10-0296183 (Oct. 22, 2001) discloses a method for designing a semiconductor integrated circuit.

SUMMARY OF THE INVENTION

The present disclosure has been conceived in response to the foregoing background art, and has been made in an effort to provide a method of automating a logical design process of a semiconductor, which relies on human intuition by using artificial intelligence.

In order to solve the foregoing object, an exemplary embodiment of the present disclosure discloses an artificial intelligence-based semiconductor design method performed by a computing device including at least one processor, the artificial intelligence-based semiconductor design method including: inputting state map information related to a connection relationship between semiconductor devices to a Convolutional Neural Network (CNN) of a semiconductor placement model; placing the semiconductor device based on an output of the convolutional neural network; and training the semiconductor placement model based on the placement of the semiconductor devices.

Alternatively, the state map information may include a connection map representing a connection relationship between semiconductor devices placed on a canvas.

Alternatively, the connection map may be generated based on: generating an adjacency matrix expressing adjacency between the semiconductor devices based on a connection relationship between the semiconductor devices; performing normalization on values of the adjacency matrix; and generating the connection map based on the normalized adjacency matrix.

Alternatively, the connection map may express a connection relationship between the semiconductor device to be placed and the semiconductor devices already placed.

Alternatively, the state map information may further include: a density map representing densities between semiconductor devices placed in a unit area; and a congestion map representing congestion of the semiconductor devices placed on the canvas.

Alternatively, the state map information may further include a feature map expressing features of semiconductor devices, and feature information of the semiconductor devices includes at least one of: size information including at least one of a width or a height of the semiconductor device; or type information indicating whether the semiconductor device is a macro cell.

Alternatively, the training of the semiconductor placement model may include: performing an action of placing the semiconductor device on a canvas based on a state related to an output of the convolutional neural network through the semiconductor placement model; estimating a reward for the action; and returning the reward to the semiconductor placement model and performing reinforcement learning on the semiconductor placement model.

Alternatively, the congestion map may be generated based on an action of calculating a ratio of second routing resources representing required resources for connecting the semiconductor devices placed on the canvas with wires to first routing resources representing supply resources to which wires are allocatable for each area of the canvas.

In order to solve the foregoing object, an exemplary embodiment of the present disclosure discloses a computer program stored in a computer readable storage medium, wherein when the computer program is executed by one or more processors, the computer program performs following operations for an artificial intelligence-based semiconductor design, the operations including: inputting state map information related to a connection relationship between semiconductor devices to a Convolutional Neural Network (CNN) of a semiconductor placement model; placing the semiconductor device based on an output of the convolutional neural network; and training the semiconductor placement model based on the placement of the semiconductor devices.

In order to solve the foregoing object, an exemplary embodiment of the present disclosure discloses a computing device for automating an artificial intelligence-based semiconductor design, the computing device including: a processor including at least one core; and a memory including program codes executed in the processor; and a network unit for receiving state map information related to a connection relationship of semiconductor devices, in which the processor inputs the state map information to a Convolutional Neural Network (CNN) of a semiconductor placement model, and places the semiconductor device based on an output of the convolutional neural network, and trains the semiconductor placement model based on the placement of the semiconductor devices.

According to the exemplary embodiment of the present disclosure, it is possible to provide the semiconductor design automation method capable of improving design quality by reducing design deviations generated by engineers while reducing time and cost required for a logical design process of semiconductors.

BRIEF DESCRIPTION OF THE DRAWINGS

FIG. 5 is a diagram illustrating a connection relationship of semiconductor devices according to the exemplary embodiment of the present disclosure.

FIG. 7 is a diagram illustrating a connection map according to the exemplary embodiment of the present disclosure.

FIG. 8 is a diagram illustrating a congestion map according to the exemplary embodiment of the present disclosure.

Figure 15:
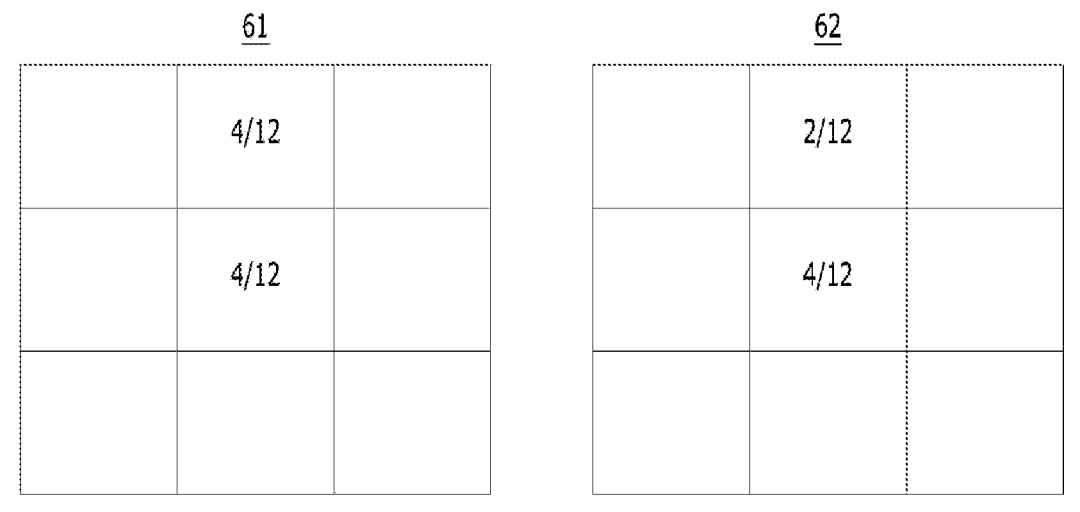

FIGS. 9 to 17 are diagrams illustrating a calculation process for estimating congestion according to the exemplary embodiment of the present disclosure.

DETAILED DESCRIPTION

Figure 1:
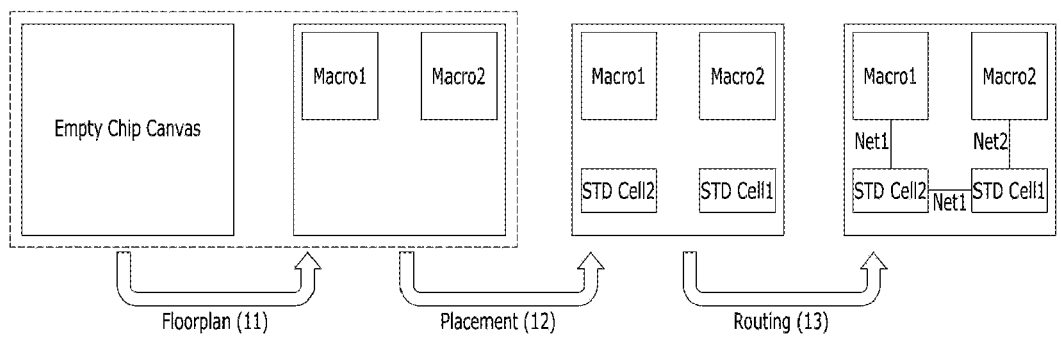
FIG. 1 is a conceptual diagram illustrating a basic semiconductor design process.

Various exemplary embodiments will now be described with reference to drawings. In the present specification, various descriptions are presented to provide appreciation of the present disclosure. However, it is apparent that the exemplary embodiments can be executed without the specific description.

"Component", "module", "system", and the like which are terms used in the specification refer to a computer-related entity, hardware, firmware, software, and a combination of the software and the hardware, or execution of the software. For example, the component may be a processing procedure executed on a processor, the processor, an object, an execution thread, a program, and/or a computer, but is not limited thereto. For example, both an application executed in a computing device and the computing device may be the components. One or more components may reside within the processor and/or a thread of execution. One component may be localized in one computer. One component may be distributed between two or more computers. Further, the components may be executed by various computer-readable media having various data structures, which are stored therein. The components may perform communication through local and/or remote processing according to a signal (for example, data transmitted from another system through a network such as the Internet through data and/or a signal from one component that interacts with other components in a local system and a distribution system) having one or more data packets, for example.

The term "or" is intended to mean not exclusive "or" but inclusive "or". That is, when not separately specified or not clear in terms of a context, a sentence "X uses A or B" is intended to mean one of the natural inclusive substitutions. That is, the sentence "X uses A or B" may be applied to any of the case where X uses A, the case where X uses B, or the case where X uses both A and B. Further, it should be understood that the term "and/or" used in this specification designates and includes all available combinations of one or more items among enumerated related items.

It should be appreciated that the term "comprise" and/or "comprising" means presence of corresponding features and/or components. However, it should be appreciated that the term "comprises" and/or "comprising" means that presence or addition of one or more other features, components, and/or a group thereof is not excluded. Further, when not separately specified or it is not clear in terms of the context that a singular form is indicated, it should be construed that the singular form generally means "one or more" in this specification and the claims.

The term "at least one of A or B" should be interpreted to mean "a case including only A", "a case including only B", and "a case in which A and B are combined".

Those skilled in the art need to recognize that various illustrative logical blocks, configurations, modules, circuits, means, logic, and algorithm steps described in connection with the exemplary embodiments disclosed herein may be additionally implemented as electronic hardware, computer software, or combinations of both sides. To clearly illustrate the interchangeability of hardware and software, various illustrative components, blocks, configurations, means, logic, modules, circuits, and steps have been described above generally in terms of their functionalities. Whether the functionalities are implemented as the hardware or software depends on a specific application and design restrictions given to an entire system. Skilled artisans may implement the described functionalities in various ways for each particular application. However, such implementation decisions should not be interpreted as causing a departure from the scope of the present disclosure.

The description of the presented exemplary embodiments is provided so that those skilled in the art of the present disclosure use or implement the present disclosure. Various modifications to the exemplary embodiments will be apparent to those skilled in the art. Generic principles defined herein may be applied to other embodiments without departing from the scope of the present disclosure. Therefore, the present disclosure is not limited to the exemplary embodiments presented herein. The present disclosure should be analyzed within the widest range which is coherent with the principles and new features presented herein.

In the present disclosure, a network function and an artificial neural network and a neural network may be interchangeably used.

FIG. 1 is a conceptual diagram illustrating a basic semiconductor design process.

For semiconductor design, netlist information defining features of semiconductor devices and connection relationships between devices is required. In the netlist information, semiconductor devices are classified into relatively large-sized macro cells and relatively small-sized standard cells. The macro cell does not have a separate size standard, and is characterized by being larger than a standard cell because the macro cell is formed of millions of transistors. For example, the macro cell includes SRAM or CPU Core. A standard cell refers to a device of a small unit formed of one or more transistors and performing a basic function. A standard cell provides simple logic operations (for example, AND, OR, XOR) or a storage function, such as flip-flops, and also provides more complex functions, such as 2-bit full adders or multiple D-input flip-flops. Unlike the macro cell, the standard cell has a standard for size.

Netlist information may be referred to as a set of nets representing connectivity of semiconductor devices. Netlist information generally represents properties and connection relationships of hundreds of macro cells and hundreds of thousands to millions of standard cells as data in a hypergraph structure. Unlike an ordinary graph in which one edge represents a connection relationship between two nodes, a hypergraph is a graph in which one edge can express a connection relationship between a plurality of nodes.

Referring to FIG. 1, a process for designing a semiconductor may be divided into three operations. First, a floorplan operation 11 is performed in which a macro cell, which is a relatively large element, is placed on an empty canvas. Next, a placement operation 12 is performed in which standard cells are placed in the remaining space after placing the macro cells on the canvas. Finally, a routing operation 13 of physically connecting the macro cells and the standard cells placed on the canvas through wires is performed.

Whether a good design has been achieved through the process described above is evaluated through a metric called PPA. PPA represents power, performance, and area. According to the PPA, the semiconductor design aims to have low production cost in a small area, that is, high integration, while exhibiting low power consumption and high performance. In order to optimize the PPA according to this goal, the length of the wire connecting the semiconductor devices needs to be reduced. If the length of the wire connecting the elements is shortened, the arrival of the electrical signal may be fast. In addition, when the arrival of the electrical signal becomes faster, the performance of the semiconductor is inevitably increased. In addition, by transmitting an electrical signal in a short time, power consumption is reduced. In addition, when the overall use of wires is reduced, the degree of integration increases and the area occupied by the devices inevitably decreases.

According to the foregoing viewpoint, simply placing all devices close together may be considered for good design. However, since routing resources indicating resources capable of allocating wires for each canvas are limited, it is practically impossible to simply place all devices close together. For example, when another wire already exists on the path where a wire for connecting two devices passes, the wire for connecting the two devices has to be placed through another canvas area while bypassing the other wire. In this case, as the wire is detoured, the length of the wire inevitably increases, and the placement of the wire for connecting subsequent devices is inevitably affected. That is, since routing resources, which are resources capable of physically allocating wires to each area of the canvas, are limited, design results are inevitably deteriorated when elements are placed without considering the routing resources.

Therefore, for a good design, it is important to consider overall connectivity including standard cells from the floor plan operation 11 in which macro cells with relatively large sizes and high connectivity are placed. Currently, the floor plan operation 11 is mainly performed through the manual work of engineers. For example, in the floor plan operation 11, macro cells are placed according to an engineer's intuition. Engineers often place macro cells at the edges of the canvas and leave space in the middle for standard cell placement. After the macro cell is placed, the engineer places the standard cell using a function provided by an existing rule-based tool. That is, the logical design process of current semiconductors is carried out largely depending on the experiences of engineers. In this method, since it is realistically very difficult to place tens to millions of devices while keeping the connection relationships of tens to millions of devices in mind, there is a problem in that the work performance speed or the quality of the result is inevitably changed according to the skill level of the engineer. In addition, there are cases where the design processes 12 and 13 following the floor plan operation 11 take more than a few days, and when the quality of the final design result is poor, the process needs to be performed again from the floor plan operation 11 to the subsequent processes 12 and 13. Repeating these cycles several times is inevitably costly considerably. Therefore, there is a need for a method capable of reducing deviation in design quality while performing fast and accurate design from the logical design operation of a semiconductor.

According to an exemplary embodiment of the present disclosure, it is possible to facilitate usability in neural network acceleration hardware (for example, MLPerf, AB9, TrueNorth, TPU, and Tianjic) specialized for Convolutional Neural Networks (CNNs) by breaking from the Graph Neural Network (GNN), which was used to reflect the connection relationship of the netlist defined in the form of a graph in the existing logical design stage of the semiconductor, and expressing state information related to the connection relationship of the placement of semiconductor devices as a 2D map. That is, in the exemplary embodiment of the present disclosure, it is possible to implement a neural network model capable of considering the connection relationship between semiconductor devices while using the hardware infrastructure of a CNN with relatively excellent computational efficiency, breaking from the GNN, which has been widely used in the past in semiconductor placement design.

Hereinafter, a method of the present disclosure devised based on the above problems will be described in detail with reference to FIGS. 2 to 21.

Figure 2:
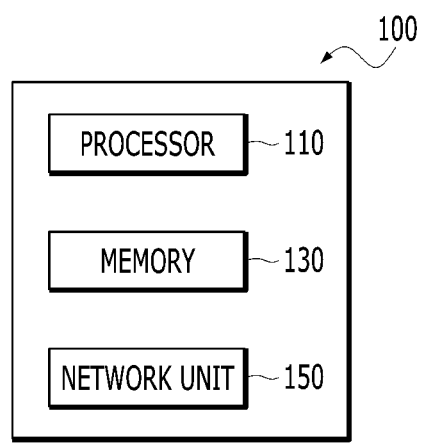
FIG. 2 is a block diagram of a computing device according to an exemplary embodiment of the present disclosure.

FIG. 2 is a block diagram of a computing device for identifying a word corresponding to a target word in text information according to an exemplary embodiment of the present disclosure.

A configuration of the computing device 100 illustrated in FIG. 2 is only an example shown through simplification. In an exemplary embodiment of the present disclosure, the computing device 100 may include other components for performing a computing environment of the computing device 100 and only some of the disclosed components may constitute the computing device 100.

The computing device 100 may include a processor 110, a memory 130, and a network unit 150.

The processor 110 may be constituted by one or more cores and may include processors for data analysis and deep learning, which include a central processing unit (CPU), a general purpose graphics processing unit (GPGPU), a tensor processing unit (TPU), and the like of the computing device. The processor 110 may read a computer program stored in the memory 130 to perform data processing for machine learning according to an exemplary embodiment of the present disclosure. According to an exemplary embodiment of the present disclosure, the processor 110 may perform a calculation for learning the neural network. The processor 110 may perform calculations for learning the neural network, which include processing of input data for learning in deep learning (DL), extracting a feature in the input data, calculating an error, updating a weight of the neural network using backpropagation, and the like. At least one of the CPU, GPGPU, and TPU of the processor 110 may process learning of a network function. For example, both the CPU and the GPGPU may process the learning of the network function and data classification using the network function. Further, in an exemplary embodiment of the present disclosure, processors of a plurality of computing devices may be used together to process the learning of the network function and the data classification using the network function. Further, the computer program executed in the computing device according to an exemplary embodiment of the present disclosure may be a CPU, GPGPU, or TPU executable program.

According to the exemplary embodiment of the present disclosure, a processor 110 may train a semiconductor placement model that performs logical design of semiconductors. For example, the processor 110 may calculate state map information related to a connection relationship between semiconductor devices by using a neural network model. In addition, the processor 110 may input state map information related to a connection relationship between semiconductor devices to a Convolutional Neural Network (CNN) of the semiconductor placement model. Also, the processor 110 may place semiconductor devices based on an output of the convolutional neural network. Also, the processor 110 may train the semiconductor placement model based on the placement of semiconductor devices. Meanwhile, the state map information may include a connection map representing a connection relationship between semiconductor devices placed on a canvas. In addition, the state map information may include a density map representing the density of semiconductor devices placed on a unit area and a congestion map representing the congestion of semiconductor devices placed on the canvas. Also, the state map information may be a 2D map.

The aforementioned neural network model may be a deep neural network. Throughout the present specification, a nerve network, a network function, and the neural network may be used with the same meaning. A deep neural network (DNN) may mean the neural network including a plurality of hidden layers, in addition to an input layer and an output layer. When the DNN is used, it is possible to recognize a latent structure of data. That is, it is possible to recognize latent structures of photos, texts, videos, voice and music (for example, what objects are in the photos, what the content and emotions of the texts are, and what the content and emotions of the voice are). The deep neural network may include a Convolutional Neural Network (CNN), a Recurrent Neural Network (RNN), a Restricted Boltzmann Machine (RBM), a Deep Belief Network (DBN), a Q network, a U network, a Siamese network, and the like.

The convolutional neural network is a kind of deep neural network, and includes a neural network including the convolutional layer. The convolutional neural network is one type of multiplayer perceptrons designed to use a minimum preprocess. The CNN may consist of one or more several convolutional layers and artificial neural network layers combined with the convolutional layers. The CNN may additionally use a weight and pooling layers. Due to the structure, the CNN may sufficiently use input data of a two-dimensional structure. The convolutional neural network may be used to recognize an object in an image. The convolutional neural network may represent and process image data with a matrix having a dimension. For example, in the case of image data encoded in red-green-blue (RGB), each R, G, and B color may be represented as two-dimensional (for example, in the case of a two-dimensional image) matrix. That is, a color value of each pixel of the image data may be a component of the matrix, and a size of the matrix may be the same as the size of the image. Accordingly, the image data may be represented with three two-dimensional matrixes (a three-dimensional data array).

A convolutional process (input/output of the convolutional layer) may be performed by multiplying a convolutional filter and a component of the matrix in each position of the image while moving the convolutional filter in the convolutional neural network. The convolutional filter may be formed of an n×n matrix. The convolutional filter may be formed of the fixed type of filter of which the number of pixels is generally smaller than the total number of pixels of the image. That is, in the case where an m×m image is input to the convolutional layer (for example, a convolutional layer in which a size of the convolutional filter is n x n), the matrix representing n×n pixels including each pixel of the image may be a multiplication of the convolutional filter and the component (that is, the multiplication of each component of the matrix). By the multiplication of the convolutional filter and the component, the component matching the convolutional filter may be extracted from the image. For example, a 3×3 convolutional filter for extracting upper and lower linear components from an image may be configured as [[0,1,0], [0,1,0], [0,1,0]]. When the 3×3 convolutional filter for extracting the upper and lower linear components from the image is applied to the input image, the upper and lower linear components matching the convolutional filter are extracted from the image and output. The convolutional layer may apply the convolutional filter to each matrix (that is, in the case of R, G, B coding image, R, G, and B colors) for each channel representing the image. The convolutional layer may extract a feature matching the convolutional filter from the input image by applying the convolutional filter to the input image. The filter value (that is, the value of each component of the matrix) of the convolutional filter may be updated by backpropagation in the training process of the convolutional neural network.

A sub-sampling layer is connected to the output of the convolutional layer to simplify the output of the convolutional layer and reduce the amount of use of the memory and the amount of computation. For example, when the output of the convolutional layer is input to the pooling layer having a 2×2 max pooling filter, the image may be compressed by outputting the maximum value included in each patch for each 2×2 patch in each pixel of the image. The foregoing pooling may also be the scheme of outputting a minimum value in the patch or outputting an average value of the patch, and a predetermined pooling scheme may be included in the present disclosure.

The convolutional neural network may include one or more convolutional layers and a sub-sampling layer. The convolutional neural network may extract a feature from an image by repeatedly performing a convolutional process and a sub-sampling process (for example, the foregoing max pooling and the like). Through the repeated convolutional process and the sub-sampling process, the neural network may extract a global feature from the image.

The output of the convolutional layer or the sub-sampling layer may be input to a fully connected layer. The fully connected layer is the layer in which all of the neurons in one layer are connected to all of the neurons in an adjacent layer.

The fully connected layer may mean a structure in which all of the nodes of each layer are connected to all of the nodes of another layer in the neural network.

The processor 110 may perform logical design of the semiconductor by using the pre-learned semiconductor placement model as described above. For example, the processor 110 may place semiconductor devices on the canvas based on the output of the convolutional neural network using the trained semiconductor placement model. The semiconductor placement model may place the semiconductor devices on the canvas so that the semiconductor devices are all connected and at the same time, the density and congestion of the semiconductor devices on the canvas are distributed as evenly as possible. This placement process corresponds to a floor plan corresponding to the logical design of semiconductors. That is, the processor 110 may effectively improve problems in terms of cost and quality of the existing floor plan method through the trained semiconductor placement model.

According to an exemplary embodiment of the present disclosure, the memory 130 may store any type of information generated or determined by the processor 110 and any type of information received by the network unit 150.

According to an exemplary embodiment of the present disclosure, the memory 130 may include at least one type of storage medium of a flash memory type storage medium, a hard disk type storage medium, a multimedia card micro type storage medium, a card type memory (for example, an SD or XD memory, or the like), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk. The computing device 100 may operate in connection with a web storage performing a storing function of the memory 130 on the Internet. The description of the memory is just an example and the present disclosure is not limited thereto.

The network unit 150 according to an exemplary embodiment of the present disclosure may use an arbitrary type known wired/wireless communication systems.

The network unit 150 may receive information for semiconductor design from an external system. For example, the network unit 150 may receive characteristic information and logical design information of a semiconductor device from a semiconductor related database. In this case, the characteristic information and the logical design information received from the database may be data for training or inference of the neural network model. The characteristic information and the logical design information of the semiconductor device may include the information of the above-described examples, but are not limited to the above-described examples and may be configured in various ways within a range understood by those skilled in the art.

The network unit 150 may receive information about a prohibited area designated so that a semiconductor device is not placed on the canvas. The network unit 150 may transmit/receive information processed by the processor 110, a user interface, and the like through communication with other terminals. For example, the network unit 150 may provide the user interface generated by the processor 110 to a client (for example, a user terminal). Further, the network unit 150 may receive the external input of the user applied to the client and transmit the received external input to the processor 110. In this case, the processor 110 may process the operations of output, correction, change, addition, and the like of the information provided through the user interface based on the external input of the user received from the network unit 150.

In the meantime, the computing device 100 according to the exemplary embodiment of the present disclosure is a computing system for transceiving information with the client through communication and may include a server. In this case, the client may be a predetermined type of terminal accessible to the server. For example, the computing device 100 as a server may receive information for semiconductor design from an external database, generate a logical design result, and provide a user interface related to the logical design result to a user terminal. In this case, the user terminal may output the user interface received from the computing device 100 that is the server, and receive or process information through interaction with the user.

In an additional exemplary embodiment, the computing device 100 may also include a predetermined type of terminal which receives data resources generated in a predetermined server and performs additional information processing.

Figure 3:
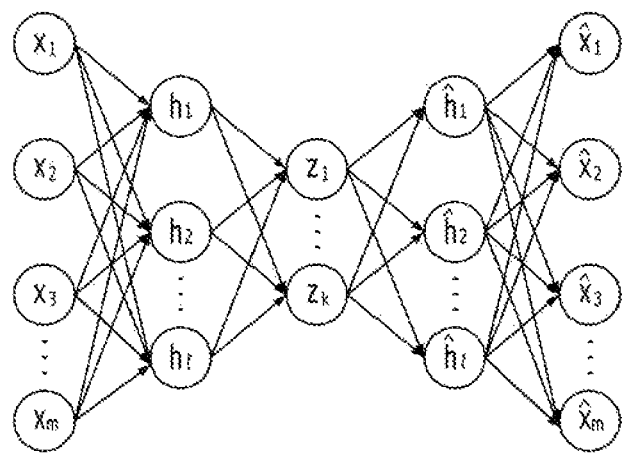
FIG. 3 is a conceptual diagram illustrating a neural network according to the exemplary embodiment of the present disclosure.

FIG. 3 is a conceptual diagram illustrating a neural network according to the exemplary embodiment of the present disclosure.

The semiconductor placement model (neural network model) according to the exemplary embodiment of the present disclosure may include a neural network for logical design of a semiconductor. A neural network may consist of a set of interconnected computational units, which may generally be referred to as nodes. The "nodes" may also be called "neurons". The neural network consists of one or more nodes. The nodes (or neurons) configuring the neural network may be interconnected by one or more links.

In the neural network, one or more nodes connected through the link may relatively form the relationship between an input node and an output node. Concepts of the input node and the output node are relative and a predetermined node which has the output node relationship with respect to one node may have the input node relationship in the relationship with another node and vice versa. As described above, the relationship of the input node to the output node may be generated based on the link. One or more output nodes may be connected to one input node through the link and vice versa.

In the relationship of the input node and the output node connected through one link, a value of data of the output node may be determined based on data input in the input node. Here, a link connecting the input node and the output node to each other may have a weight. The weight may be variable and the weight is variable by a user or an algorithm in order for the neural network to perform a desired function. For example, when one or more input nodes are mutually connected to one output node by the respective links, the output node may determine an output node value based on values input in the input nodes connected with the output node and the weights set in the links corresponding to the respective input nodes.

As described above, in the neural network, one or more nodes are connected to each other through one or more links to form a relationship of the input node and output node in the neural network. A characteristic of the neural network may be determined according to the number of nodes, the number of links, correlations between the nodes and the links, and values of the weights granted to the respective links in the neural network. For example, when the same number of nodes and links exist and there are two neural networks in which the weight values of the links are different from each other, it may be recognized that two neural networks are different from each other.

The neural network may be constituted by a set of one or more nodes. A subset of the nodes constituting the neural network may constitute a layer. Some of the nodes constituting the neural network may constitute one layer based on the distances from the initial input node. For example, a set of nodes of which distance from the initial input node is n may constitute n layers. The distance from the initial input node may be defined by the minimum number of links which should be passed through for reaching the corresponding node from the initial input node. However, a definition of the layer is predetermined for description and the order of the layer in the neural network may be defined by a method different from the aforementioned method. For example, the layers of the nodes may be defined by the distance from a final output node.

The initial input node may mean one or more nodes in which data is directly input without passing through the links in the relationships with other nodes among the nodes in the neural network. Alternatively, in the neural network, in the relationship between the nodes based on the link, the initial input node may mean nodes which do not have other input nodes connected through the links. Similarly thereto, the final output node may mean one or more nodes which do not have the output node in the relationship with other nodes among the nodes in the neural network. Further, a hidden node may mean nodes constituting the neural network other than the initial input node and the final output node.

In the neural network according to an exemplary embodiment of the present disclosure, the number of nodes of the input layer may be the same as the number of nodes of the output layer, and the neural network may be a neural network of a type in which the number of nodes decreases and then, increases again from the input layer to the hidden layer. Further, in the neural network according to another exemplary embodiment of the present disclosure, the number of nodes of the input layer may be smaller than the number of nodes of the output layer, and the neural network may be a neural network of a type in which the number of nodes decreases from the input layer to the hidden layer. Further, in the neural network according to yet another exemplary embodiment of the present disclosure, the number of nodes of the input layer may be larger than the number of nodes of the output layer, and the neural network may be a neural network of a type in which the number of nodes increases from the input layer to the hidden layer. The neural network according to still yet another exemplary embodiment of the present disclosure may be a neural network of a type in which the neural networks are combined.

A deep neural network (DNN) may refer to a neural network that includes a plurality of hidden layers in addition to the input and output layers. When the deep neural network is used, the latent structures of data may be determined. That is, latent structures of photos, text, video, voice, and music (e.g., what objects are in the photo, what the content and feelings of the text are, what the content and feelings of the voice are) may be determined. The deep neural network may include a convolutional neural network (CNN), a recurrent neural network (RNN), an auto encoder, generative adversarial networks (GAN), a restricted Boltzmann machine (RBM), a deep belief network (DBN), a Q network, a U network, a Siam network, a Generative Adversarial Network (GAN), and the like. The description of the deep neural network described above is just an example and the present disclosure is not limited thereto.

In an exemplary embodiment of the present disclosure, the network function may include the auto encoder. The auto encoder may be a kind of artificial neural network for outputting output data similar to input data. The auto encoder may include at least one hidden layer and odd hidden layers may be disposed between the input and output layers. The number of nodes in each layer may be reduced from the number of nodes in the input layer to an intermediate layer called a bottleneck layer (encoding), and then expanded symmetrical to reduction to the output layer (symmetrical to the input layer) in the bottleneck layer. The auto encoder may perform non-linear dimensional reduction. The number of input and output layers may correspond to a dimension after preprocessing the input data. The auto encoder structure may have a structure in which the number of nodes in the hidden layer included in the encoder decreases as a distance from the input layer increases. When the number of nodes in the bottleneck layer (a layer having a smallest number of nodes positioned between an encoder and a decoder) is too small, a sufficient amount of information may not be delivered, and as a result, the number of nodes in the bottleneck layer may be maintained to be a specific number or more (e.g., half of the input layers or more).

The neural network may be learned in at least one scheme of supervised learning, unsupervised learning, semi supervised learning, or reinforcement learning. The learning of the neural network may be a process in which the neural network applies knowledge for performing a specific operation to the neural network.

The neural network may be learned in a direction to minimize errors of an output. The learning of the neural network is a process of repeatedly inputting learning data into the neural network and calculating the output of the neural network for the learning data and the error of a target and back-propagating the errors of the neural network from the output layer of the neural network toward the input layer in a direction to reduce the errors to update the weight of each node of the neural network. In the case of the supervised learning, the learning data labeled with a correct answer is used for each learning data (i.e., the labeled learning data) and in the case of the unsupervised learning, the correct answer may not be labeled in each learning data. That is, for example, the learning data in the case of the supervised learning related to the data classification may be data in which category is labeled in each learning data. The labeled learning data is input to the neural network, and the error may be calculated by comparing the output (category) of the neural network with the label of the learning data. As another example, in the case of the unsupervised learning related to the data classification, the learning data as the input is compared with the output of the neural network to calculate the error. The calculated error is back-propagated in a reverse direction (i.e., a direction from the output layer toward the input layer) in the neural network and connection weights of respective nodes of each layer of the neural network may be updated according to the back propagation. A variation amount of the updated connection weight of each node may be determined according to a learning rate. Calculation of the neural network for the input data and the back-propagation of the error may constitute a learning cycle (epoch). The learning rate may be applied differently according to the number of repetition times of the learning cycle of the neural network. For example, in an initial stage of the learning of the neural network, the neural network ensures a certain level of performance quickly by using a high learning rate, thereby increasing efficiency and uses a low learning rate in a latter stage of the learning, thereby increasing accuracy.

In learning of the neural network, the learning data may be generally a subset of actual data (i.e., data to be processed using the learned neural network), and as a result, there may be a learning cycle in which errors for the learning data decrease, but the errors for the actual data increase. Overfitting is a phenomenon in which the errors for the actual data increase due to excessive learning of the learning data. For example, a phenomenon in which the neural network that learns a cat by showing a yellow cat sees a cat other than the yellow cat and does not recognize the corresponding cat as the cat may be a kind of overfitting. The overfitting may act as a cause which increases the error of the machine learning algorithm. Various optimization methods may be used in order to prevent the overfitting. In order to prevent the overfitting, a method such as increasing the learning data, regularization, dropout of omitting a part of the node of the network in the process of learning, utilization of a batch normalization layer, etc., may be applied.

Figure 4:
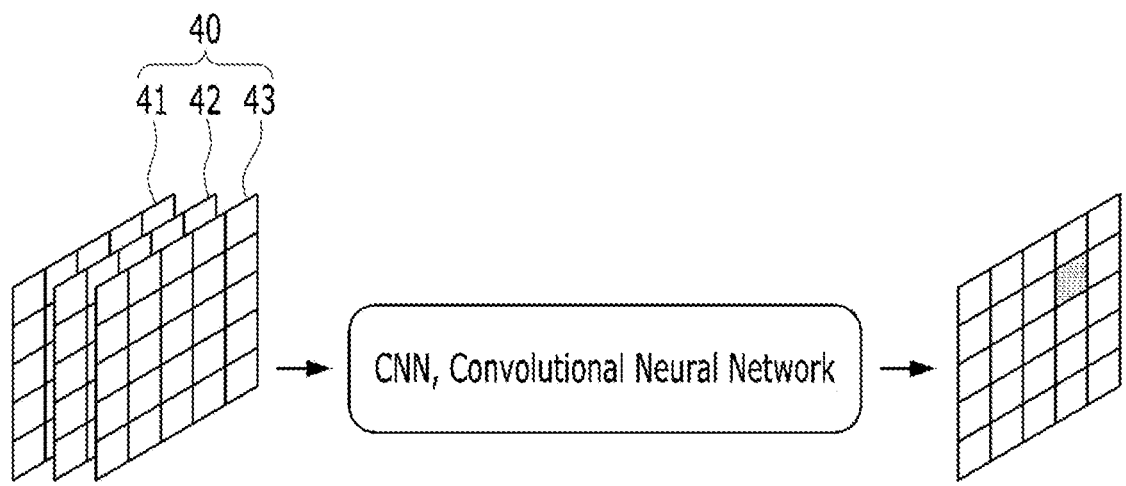
FIG. 4 is a diagram schematically illustrating a process of an artificial intelligence-based semiconductor design method according to the exemplary embodiment of the present disclosure.

FIG. 4 is a diagram schematically illustrating a process of an artificial intelligence-based semiconductor design method according to the exemplary embodiment of the present disclosure.

Referring to FIG. 4, the processor 110 may sequentially input state map information 40 related to a connection relationship of semiconductor devices to the convolutional neural network of the semiconductor placement model. Also, the processor 110 may place semiconductor devices based on an output of the convolutional neural network. Here, the state map information 40 may include a density map 41, a connection map 42, and a congestion map 43. The density map 41 represents the density between semiconductor devices placed in a unit area. The connection map 42 represents a connection relationship between semiconductor devices placed on the canvas. The congestion map 43 represents the congestion of semiconductor devices placed on the canvas.

According to the exemplary embodiment of the present disclosure, the state map information may further include a feature map representing features of semiconductor devices. The feature information of the semiconductor devices included in the feature map may include at least one of size information including at least one of a width or a height of the semiconductor device, or type information indicating whether the semiconductor device is a macro cell. Also, the feature information may include numerical value information indicating the number of other elements connected to the semiconductor device. Meanwhile, the feature information is not limited thereto and may include all features related to the semiconductor device.

In addition, according to the exemplary embodiment of the present disclosure, the processor 110 may stack the features of the N semiconductor devices into N channels and additionally inputs the stacked features to the convolutional neural network, and place the semiconductor devices based on the output of the convolutional neural network. Particularly, the processor 110 may generate N feature maps for features of each of the N semiconductor devices, input the generated N feature maps to the convolutional neural network together with the state maps (that is, the connectivity map, the density map, and the congestion map) described above, and place semiconductor devices on the canvas based on the output of the convolutional neural network.

FIG. 5 is a diagram illustrating a connection relationship of semiconductor devices according to the exemplary embodiment of the present disclosure. For semiconductor design, netlist information defining features of semiconductor devices and connection relationships between devices is required. Illustratively, referring to FIG. 5, a first net Net_0 may include a first semiconductor device Cell_0, a second semiconductor device Cell_1, and a third semiconductor device Cell_2. A second net Net_1 may include a second semiconductor device Cell_1 and a third semiconductor device Cell_2. A third net Net_2 may include a first semiconductor device Cell_0 and a second semiconductor device Cell_1. A fourth net Net_3 may include a first semiconductor device Cell_0 and a third semiconductor device Cell_2.

An example described below with reference to FIGS. 6 to 8 may be a situation in which the first semiconductor device Cell_0 and the second semiconductor device Cell_1 are currently placed on the canvas, and the third semiconductor device Cell_2 is placed on the canvas. In other words, a result value of the density map shown in FIG. 6 may be a result calculated by considering the densities of the first semiconductor device Cell_0 and the second semiconductor device Cell_1 placed in a unit area. Also, a result value of the connection map shown in FIG. 7 may be a result calculated by considering the connection relationship between the first semiconductor device Cell_0 and the second semiconductor device Cell_1 placed on the canvas. In addition, a result value of the congestion map shown in FIG. 8 may be a result calculated by considering congestions of the first semiconductor device Cell_0 and the second semiconductor device Cell_1 placed on the canvas.

Figure 6:
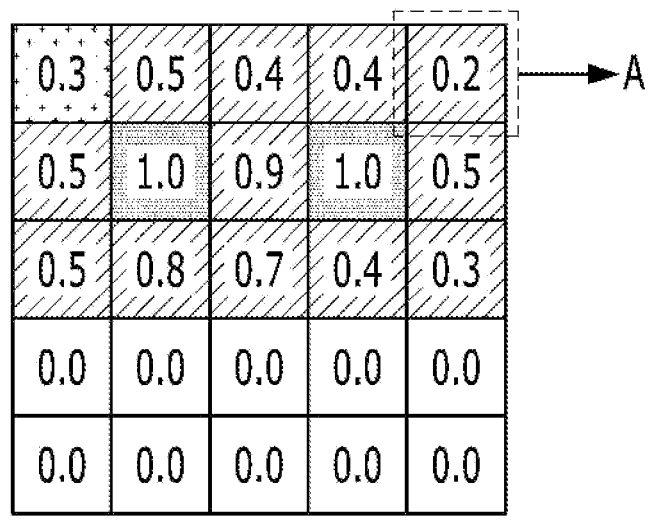
FIG. 6 is a diagram illustrating a density map according to the exemplary embodiment of the present disclosure.

FIG. 6 is a diagram illustrating the density map according to the exemplary embodiment of the present disclosure. A density map represents a density between semiconductor devices placed in a unit area. The density map may be information visualizing the current placement state. For example, the density value (A) calculated based on the grid cell (0, 4) may be derived from Equation 1 below, and Equation 1 may be expressed as follows.

$$\text{density} = \frac{\sum_{cells} area_{reserved}}{area_{min}} \quad \text{[Equation 1]}$$

FIG. 7 is a diagram illustrating the connection map according to the exemplary embodiment of the present disclosure. A connection map is a map that breaks away from (detaches) a Graph Neural Network (GNN) and facilitates the use of a Convolutional Neural Network (CNN).

The processor 110 may generate an adjacency matrix expressing adjacency between semiconductor devices based on a connection relationship between semiconductor devices to generate a connection map. For example, the processor 110 may generate the adjacency matrix shown in (a) of FIG. 7 based on the connection relationship of the semiconductor devices shown in FIG. 5. Referring to FIG. 5, a weighted sum of the first semiconductor device Cell_0 and the second semiconductor device Cell_1 may be a result calculated in consideration of semiconductor device information included in the first net Net_0 and the third net Net_2. In other words, in generating the adjacency matrix, the processor 110 may assign a value of 1 as a weight between semiconductor devices included in the same net. That is, the adjacency matrix may be generated by considering whether the semiconductor devices are included in the same net.

Additionally, the processor 110 may perform normalization on the values of the adjacency matrix to generate a connection map. The normalization may be performed through min-max normalization, but is not limited thereto. Illustratively, (b) of FIG. 7 is a result of performing normalization on the values of the adjacency matrix shown in (a) of FIG. 7.

The processor 110 may generate a connection map based on the normalized adjacency matrix. Illustratively, (c) of FIG. 7 may be a result of the connection map generated based on the normalized adjacency matrix shown in (b) of FIG. 7. (c) of FIG. 7 is a connection map representing connectivity between a cell to be placed at a specific time and a previously placed cell. In other words, the connection map represents the connectivity between the third semiconductor device Cell_2 to be currently placed and the first semiconductor device Cell_0 and the second semiconductor device Cell_1 previously placed on the canvas.

FIG. 8 is a diagram illustrating the congestion map according to the exemplary embodiment of the present disclosure.

The processor 110 may generate the congestion map 43 based on an operation of calculating a ratio of second routing resources representing required resources for connecting the semiconductor devices placed on the canvas with wires to first routing resources representing supply resources to which wires are allocatable for each area of the canvas. For example, the congestion may be expressed as Equation 2 below.

$$C(v) = \text{demand}(v)/\text{supply}(v) \qquad \text{[Equation 2]}$$

Here, v represents a grid cell, which is the basic unit of the canvas area. Further, C(v) represents congestion, supply(v) represents a first routing resource provided by grid cells of the canvas, and demand(v) represents a second routing resource required to connect the semiconductor devices with the wires. According to [Equation 2], since the congestion is proportional to the second routing resource, it may be expected that the overall congestion may be lowered by reducing the second routing resources.

FIGS. 9 to 17 are diagrams illustrating a calculation process for estimating congestion according to the exemplary embodiment of the present disclosure. The calculation process of estimating the above-described congestion will be described in more detail with reference to FIGS. 9 to 17 below.

Figure 9:
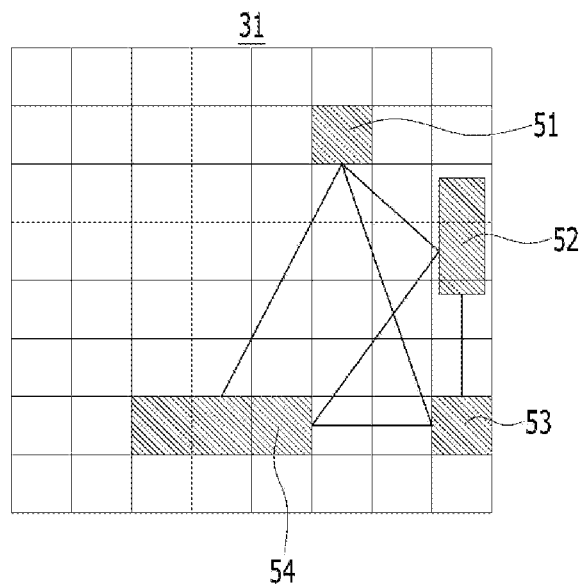
Figure 10:
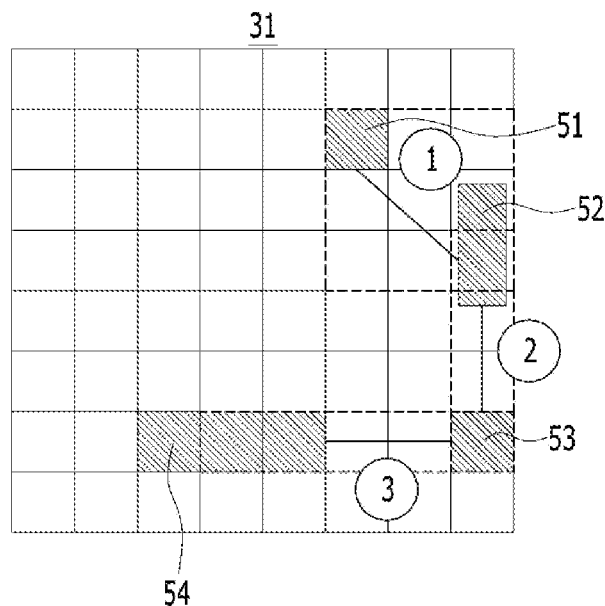

The processor 110 according to the exemplary embodiment of the present disclosure may generate a complete graph representing a state in which all semiconductor devices placed on the canvas are connected to each other through the action. The processor 110 may transform the complete graph into a minimum spanning tree. The processor 110 converts the connection relationship of the complete graph into a minimum spanning tree to express all the devices to be directly or indirectly connected with the minimum number of edges. Considering the PPA, since it may be assumed that the final routing result corresponding to the physical design of semiconductor devices follows the form of the minimum spanning tree approximately, the processor 110 converts the complete graph into the minimum spanning tree to estimate the congestion. For example, when there are four semiconductor devices 51, 52, 53, and 54 placed on the canvas 31 through an action, the processor 110 may generate the complete graph connecting four semiconductor devices 51, 52, 53, and 54 as illustrated in FIG. 9. As illustrated in FIG. 10, the processor 110 may convert the complete connection graph into a minimum spanning tree. Here, the minimum spanning tree may be understood as a graph that connects all four semiconductor devices 51, 52, 53, and 54 and minimizes the number and length of edges.

The processor 110 may calculate a routing resource for each edge constituting the minimum spanning tree. Here, the routing resource may be understood as a resource required for connection of the devices whose connection relationship is defined to an edge. Specifically, the processor 110 may calculate the number of cases for connecting the semiconductor devices with wires in the canvas in consideration of the placement of the semiconductor devices corresponding to the node of the edge. The processor 110 may calculate an expected value for a form in which the wire is placed on the canvas for each grid cell in consideration of the number of each case. In this case, the expected value of the form in which the wire is to be placed on the canvas may include a first expected value in which the wire is to be vertically placed in the grid cell of the canvas, and a second expected value in which the wire is to be horizontally placed in the grid cell of the canvas. The processor 110 may calculate a routing resource for each edge based on the calculated number of cases and the calculated expected value.

For example, referring to FIG. 10, the processor 110 may divide grid cell areas required to calculate routing resources of each of the three edges constituting the minimum spanning tree into an area ①, an area ②, and an area ③. The processor 110 may calculate routing resources of each of the three edges based on each area. That is, the processor 110 may calculate routing resources required for connection of the devices whose connection relationship is defined with the edge for each of the area ①, the area ②, and the area ③.

Figure 11:
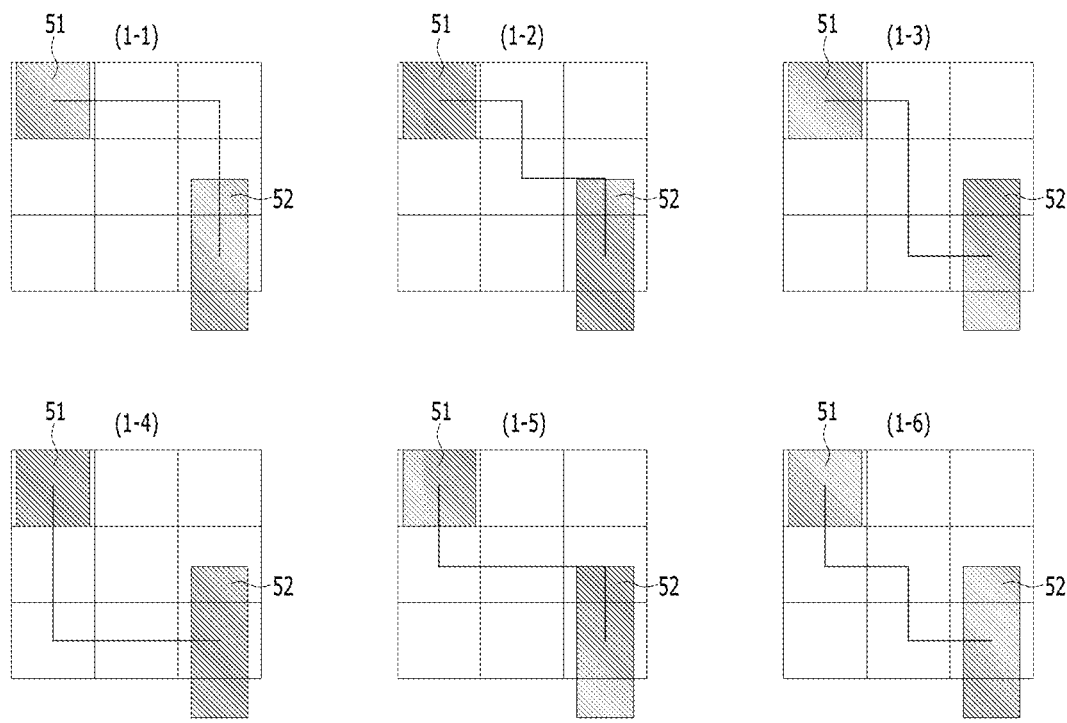
Figure 12:
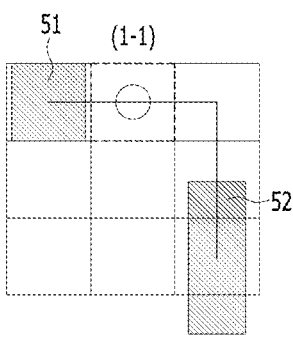
Figure 12:
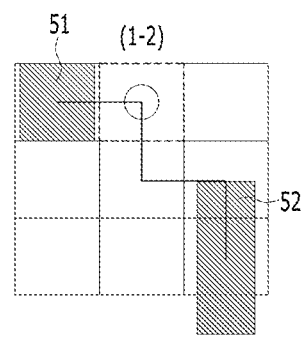
Figure 12:
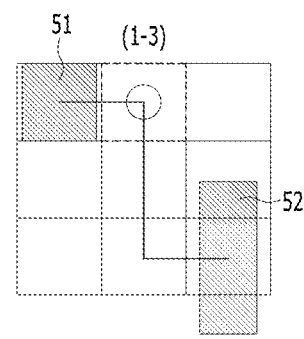
Figure 12:
Figure 12:
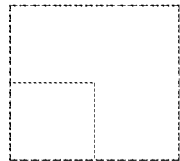
Figure 12:
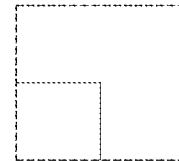
Figure 13:
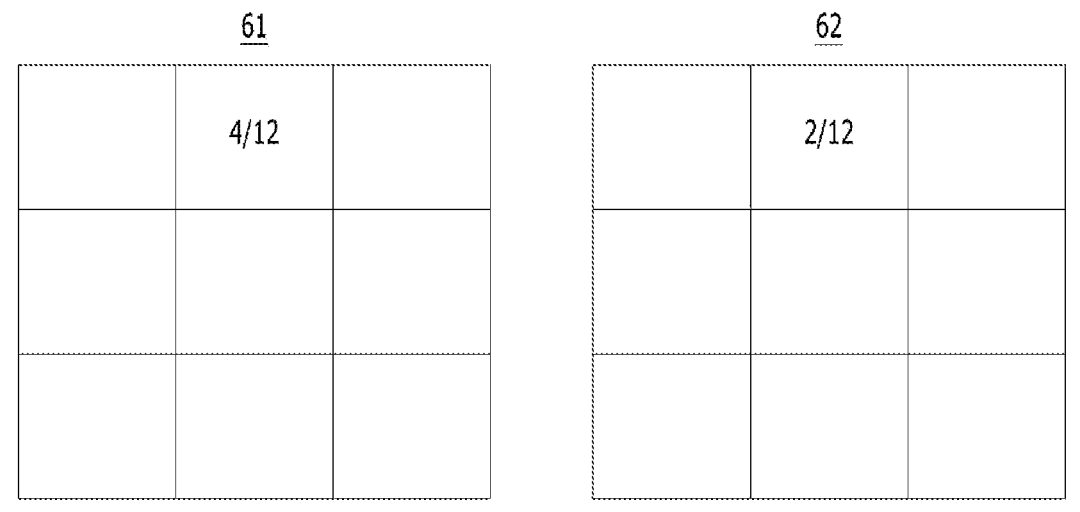
Figure 14:
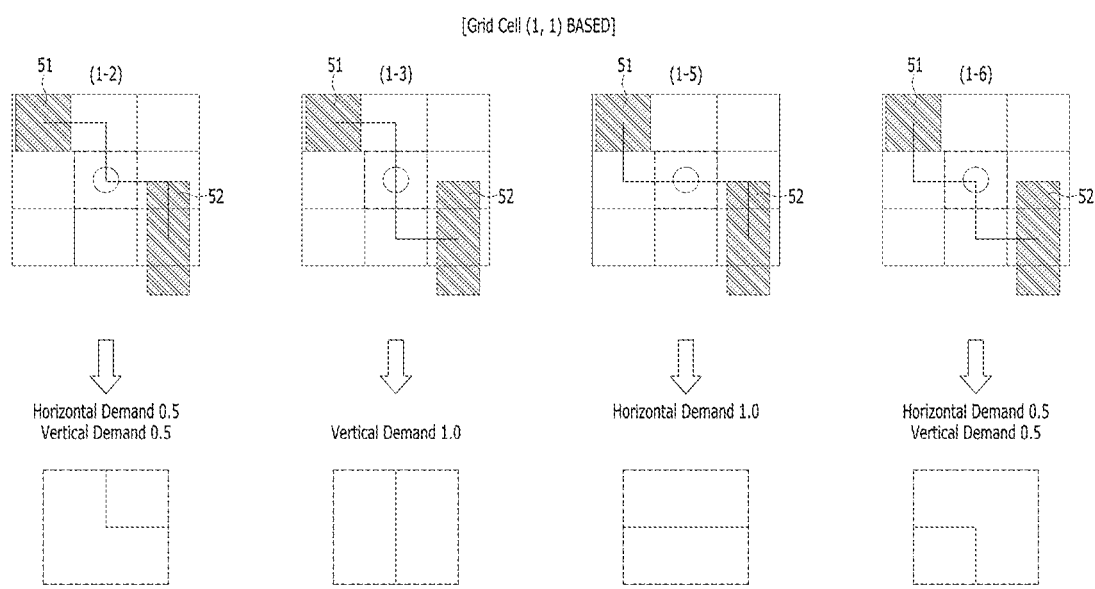

Referring to the area ①, the number of cases in which the two devices 51 and 52 existing in the area ① are connected with the wires may be six from (1-1) to (1-6) as illustrated in FIG. 11. That is, the processor 110 may calculate the number of cases for physically connecting the devices based on the area ① as six. In addition, the processor 110 may calculate an expected value for a form in which the wire is to be placed on the canvas individually for the grid cells constituting the area ①. Referring to FIG. 12, in the case of a grid cell (0,1), the number of cases for connecting the two devices 51 and 52 may correspond to (1-1), (1-2), and (1-3). Therefore, for the grid cell (0,1), the processor 110 may calculate a first expected value, which is an expected value indicating that the wire is to be vertically placed, and a second expected value, which is an expected value indicating that the wire is to be horizontally placed, in consideration of the number of three cases (1-1), (1-2), and (1-3). The processor 110 may calculate the result obtained by calculating a product of the probability of selecting the number of each of the three cases and the routing resource for the form in which the wire is to be placed in the grid cell (0,1) according to the number of three cases, and summing the products as a first expected value and a second expected value. In this case, the probability of selecting the number of each of the three cases is ⅙, which is the probability that one of the six paths for connecting the two devices 51 and 52 is randomly selected based on the area ①. Accordingly, the first expected value may be calculated as (1/6*1.0)+(1/6*0.5)+(1/6*0.5)=4/12. Also, the second expected value may be calculated as (0)+(1/6*0.5)+(1/6*0.5)=2/12. The processor 110 may store the first expected value and the second expected value calculated based on the grid cell (0,1) at the positions of (0,1) of a first expected value map 61 and a second expected value map 62 for the area ① illustrated in FIG. 13, respectively.

Referring to FIG. 12, in the case of a grid cell (1,1), the number of cases for connecting the two devices 51 and 52 may correspond to (1-2), (1-3), (1-5), and (1-6). Therefore, for the grid cell (1,1), the processor 110 may calculate the first expected value that is an expected value indicating that the wire is to be vertically placed and the second expected value that is an expected value indicating that the wire is to be horizontally placed in consideration of the number of four cases of (1-2), (1-3), (1-5), and (1-6). The processor 110 may calculate the result obtained by calculating a product of the probability of selecting the number of each of the four cases and the routing resource for the form in which the wire is to be placed in the grid cell (1,1) according to the number of each of the three cases, and summing the products as a first expected value and a second expected value. In this case, the probability of selecting the number of each of the four cases is ⅙, which is the probability that one of the six paths for connecting the two devices 51 and 52 is randomly selected based on the area ①. Accordingly, the first expected value may be calculated as (1/6*0.5)+(0)+(1/6*1.0)+(1/6*0.5)=4/12. Also, the second expected value may be calculated as (1/6*0.5)+(1/6*1.0)+(0)+(1/6*0.5)=4/12. The processor 110 may store the first expected value and the second expected value calculated based on the grid cell (1,1) at the positions of (1,1) of a first expected value map 61 and a second expected value map 62 for the area ① illustrated in FIG. 15, respectively.

The processor 110 performs the calculation as in the above example on all grid cells of the area ①, to store the expected value of each of all areas of the first expected value map 61 and the second expected value map 62 as illustrated in FIG. 16. In addition, the processor 110 performs the calculation as in the above example on not only the area ① but also for the areas ② and ③, to generate the first expected value map and the second expected value map for all three areas where the edges exist. In this case, the first expected value map and the second expected value map of each area may correspond to the routing resource of each edge.

The processor 110 may cumulatively sum the routing resources for each edge and estimate the congestion based on a result value derived through the cumulative sum. Specifically, the processor 110 may estimate the second routing resource by averaging the values of the top N % (N is a natural number) among the result values derived through the cumulative sum. The processor 110 may calculate a ratio of the first routing resource by using the estimated second routing resource and estimate the congestion. The processor 110 may prevent a very high second routing resource from appearing in a specific area of the canvas by reflecting the values of the top N % of the cumulative sum of the edge routing resources in estimating the congestion. That is, the processor 110 may evenly distribute the second routing resources in all canvas areas, so that the congestion of the entire canvas area may be appropriately reflected in a reward.

Figure 17:
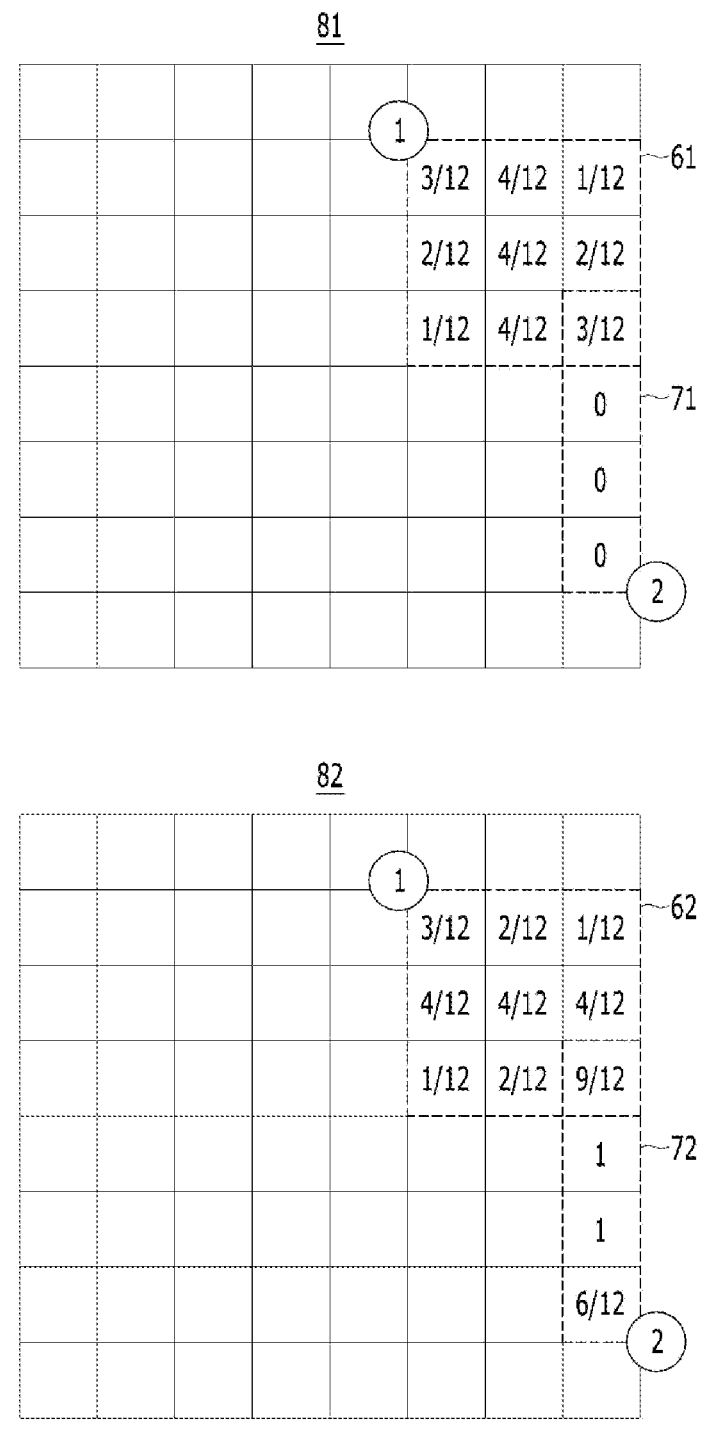

For example, referring to FIG. 17, the processor 110 may reflect the first expected value map and the second expected value map generated for all three areas where the edges exist to global maps 81 and 82 representing the entire area of the canvas. In the process of reflecting each expected value map, the processor 110 may perform a cumulative sum on an area where each expected value map overlaps. That is, the expected values of the grid cells (3, 7) where the expected value maps 61 and 62 of the area ① and the expected value maps 71 and 72 of the area ② overlap are summed and stored as 3/12 and 9/12 in the global maps 81 and 82, respectively. The processor 110 may update the global maps 81 and 82 for all edge areas in this way, average the highest 10% values, and use the average as an estimated value of the congestion.

According to the exemplary embodiment of the present disclosure, the processor 110 may estimate a reward based on an action of the semiconductor placement model based on a state of an output of a convolutional neural network. In this case, the reward may include a length of a wire connecting the semiconductor devices placed on the canvas through the action, and congestion of the semiconductor devices placed on the canvas through the action. For example, the reward may be calculated as a weighted sum of the length of the wire and the congestion. The reward calculated as the weighted sum of the length of the wire and the congestion may be expressed as the following [Equation 3].

$$R_{p,g} = -\alpha W(p,g) - \beta C(p,g)$$ [Equation 3]

Here, p denotes placement and g denotes a graph. Further, $R_{p,g}$ represents a reward, α and β represent coefficients for adjusting the overall scale, W(p,g) represents the length of the wire, and C(p,g) represents congestion. As shown in [Equation 3], the reward of the present disclosure may be derived through a weighted sum that flexibly adjusts the length of the wire and the size of the congestion through the coefficients.

According to the exemplary embodiment of the present disclosure, the length of the wire may be calculated as half of the circumference of the area where the devices having a connection relationship are placed. For example, when it is assumed that there is one net completely placed in one quadrangular area (that is, the devices completely placed in a certain area of the canvas), half of the circumference of the quadrangular area encompassing the net may be estimated as the length of the wire. The processor 110 may estimate the total sum as the length of the wire after performing the above-described calculation for all nets.

Figure 18:
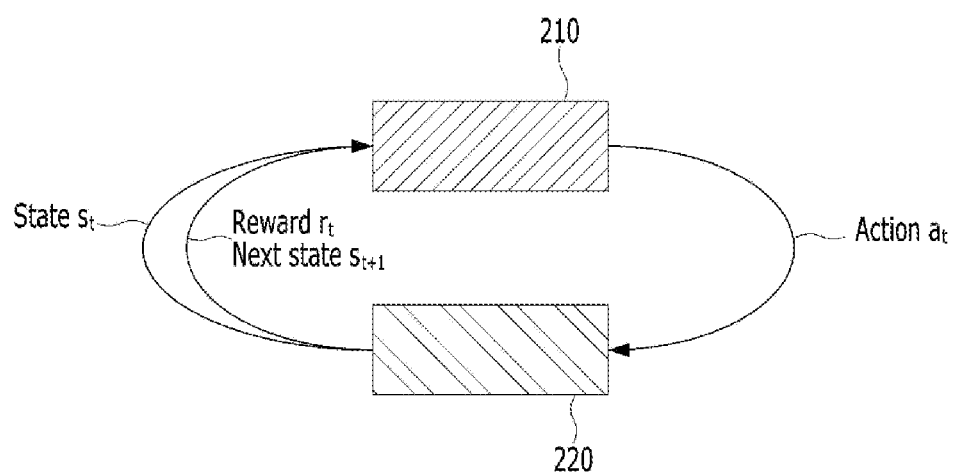
FIG. 18 is a conceptual diagram illustrating a reinforcement learning process.

FIG. 18 is a conceptual diagram illustrating a reinforcement learning process.

Reinforcement learning is a learning method in which a neural network model is trained based on a reward calculated for an action selected by the neural network model so that the semiconductor placement model (neural network model) is capable of determining a better action based on the state. The state is a set of values representing how a situation is at the current point in time, and may be understood as an input to a neural network model. The action refers to a decision based on the options that the neural network model can take, and may be understood as an output of the neural network model. The reward refers to the benefit that follows when a neural network model performs a certain action, and represents an immediate value evaluated for the current state and action. The reinforcement learning may be understood as learning through trial and error in that decisions (that is, actions) are rewarded. The reward given to the neural network model in the reinforcement learning process may be a reward obtained by accumulating results of various actions. Through the reinforcement learning, it is possible to generate a neural network model so that a return, such as the reward itself or the sum of the rewards, is maximized by considering rewards according to various states and actions. In the present disclosure, the neural network model may be used interchangeably with the term agent, which is a subject that determines what action to take according to surrounding states. Referring to FIG. 18, in the reinforcement learning, an environment 220 to which an agent 210 belongs exists.

The environment 220 may be understood to mean the setting itself for reinforcement learning of the agent 210. When the agent 210 takes an action, the state is changed through the environment 220, and the agent 210 may receive a reward. The goal of reinforcement learning is to train the agent 210 to receive as many rewards as possible in the given environment 220.

The processor 110 according to the exemplary embodiment of the present disclosure may train the neural network model through the reinforcement learning based on a state for the output of the convolution neural network, the action to place a semiconductor device on the canvas, and a reward for the action. The processor 110 may cause the neural network model to perform an action of placing one semiconductor device on the canvas per cycle, and return the reward according to the action along with the state to cause the neural network model to perform an action according to the next cycle, to perform the reinforcement learning on the neural network model. For example, the processor 110 may perform an action at a specific time point t of placing a semiconductor device on a canvas based on a state at the specific time point t through the neural network model. The processor 110 may estimate a reward at a next time point t+1 for the action at the specific time point t and return the estimated reward to the neural network model. The processor 110 may perform an action at the next time point t+1 by inputting the state and the reward of the next time point t+1 to the neural network model. The processor 110 may repeat the cycle to perform reinforcement learning on the neural network model so that the PPA, which is an evaluation index of the logical design of the semiconductor, is optimized.

According to the exemplary embodiment of the present disclosure, the state entered as an input of the semiconductor placement model may include a result of learning performed in the convolutional neural network based on the state map information. For example, the state map information may include a connection map representing the connection relationship of semiconductor devices placed on the canvas, a density map representing the density between semiconductor devices placed in a unit area, and a congestion map representing congestion of semiconductor devices placed on the canvas. In addition, the state map information may further include a feature map expressing features of semiconductor devices. Feature information included in the feature map may include size information including the width or height of the semiconductor device. Feature information may include type information representing whether the semiconductor device is a macro cell. Since the semiconductor placement model places semiconductor devices on the canvas in order of increasing size, the semiconductor placement model may be trained to place semiconductor devices on the canvas in order from macro cells to standard cells through type information. The feature information may include numerical value information indicating the number of other elements connected to the semiconductor device. The feature information of the example may be understood as information for identifying a semiconductor device to be placed at a specific time by the semiconductor placement model.

Figure 19:
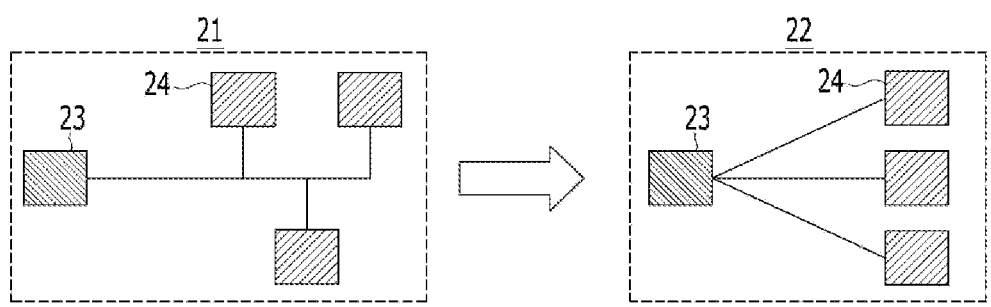
FIG. 19 is a conceptual diagram illustrating a preprocessing process for a state of a semiconductor placement model according to the exemplary embodiment of the present disclosure.

FIG. 19 is a conceptual diagram illustrating a preprocessing process for a state of the neural network model according to the exemplary embodiment of the present disclosure.

According to the exemplary embodiment of the present disclosure, a state to be entered as an input of a semiconductor placement model (neural network model) may include logical design information about placement between semiconductor devices. For example, the logical design information may include index information about the placement order of the semiconductor devices. The semiconductor placement model (neural network model) may place the semiconductor devices on the canvas in order of increasing size through index information. The logical design information may include netlist information indicating a connection relationship between semiconductor devices. In this case, the netlist information may be data of a hypergraph structure. Since the data in the hypergraph structure is phenotypic data in a many-to-many relationship, the data itself has a fairly complex structure to analyze. Accordingly, the processor 110 may pre-process the netlist information of the hypergraph structure so that the semiconductor placement model is capable of effectively processing the netlist information.

Specifically, the processor 110 may convert the netlist information of the hypergraph structure into a ordinary graph structure that expresses a connection relationship between the semiconductor devices on a one-to-one basis. For example, referring to FIG. 19, the processor 110 may convert netlist information having a hypergraph structure 21 into netlist information having a ordinary graph structure 22. The hypergraph structure 21 corresponds to a many-to-many structure in which a drive cell 23 corresponding to an input element and a load cell 24 corresponding to an output element are all connected by one edge. In contrast, the ordinary graph structure 22 corresponds to a structure in which the drive cell 23 and the load cell 24 have a one-to-one relationship so that two devices are connected to one edge. That is, the processor 110 may convert the netlist information of the hypergraph structure 21 into the ordinary graph structure 22 so that the drive cells 23 and the load cells 24 have a one-to-one relationship. The processor 110 may perform reinforcement learning by inputting a state including netlist information of the ordinary graph structure 22 generated through the conversion to the semiconductor placement model.

Figure 20:
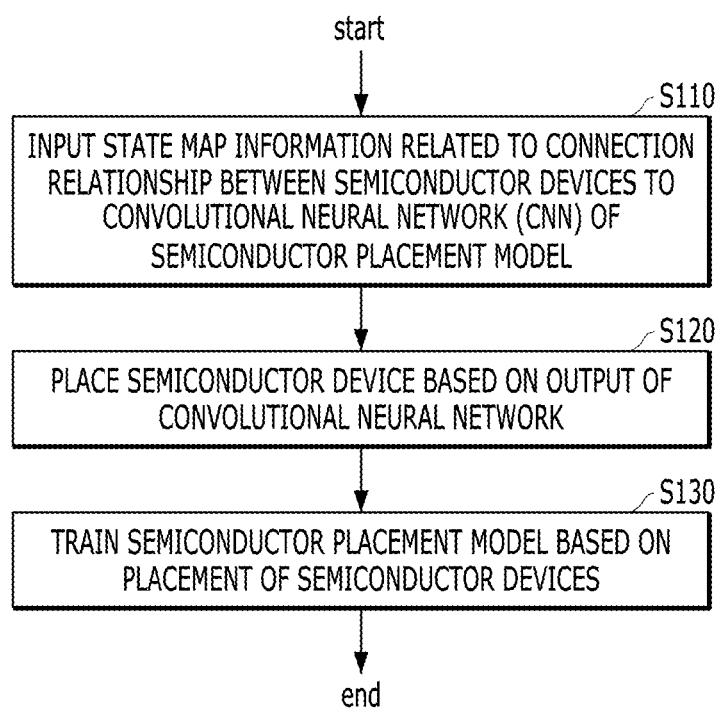
FIG. 20 is a flowchart illustrating an artificial intelligence-based semiconductor design method according to the exemplary embodiment of the present disclosure.

FIG. 20 is a flowchart illustrating an artificial intelligence-based semiconductor design method according to the exemplary embodiment of the present disclosure.

Referring to FIG. 20, the computing device 100 according to the exemplary embodiment of the present disclosure may input state map information related to a connection relationship between semiconductor devices to a Convolutional Neural Network (CNN) of a semiconductor placement model (S110). In this case, the state map information may include a connection map representing the connection relationship of semiconductor devices placed on the canvas, a density map representing the density between semiconductor devices placed in a unit area, and a congestion map representing congestion of semiconductor devices placed on the canvas. The computing device 100 may facilitate use in neural net acceleration hardware specialized for convolutional neural networks by using the state map information.

The computing device 100 may place semiconductor devices based on the output of the convolutional neural network (S120). The computing device 100 may place semiconductor devices on the canvas based on the output of the convolutional neural network. The computing device 100 may train the semiconductor placement model based on the placement of the semiconductor devices (S130). The computing device 100 may optimize a PPA by using the semiconductor placement model trained through reinforcement learning and reduce design cost and design quality deviation, which are problems of existing design methods.

In the meantime, according to an embodiment of the present disclosure, a computer readable medium storing a data structure is disclosed.

The data structure may refer to organization, management, and storage of data that enable efficient access and modification of data. The data structure may refer to organization of data for solving a specific problem (for example, data search, data storage, and data modification in the shortest time). The data structure may also be defined with a physical or logical relationship between the data elements designed to support a specific data processing function. A logical relationship between data elements may include a connection relationship between user defined data elements. A physical relationship between data elements may include an actual relationship between the data elements physically stored in a computer readable storage medium (for example, a permanent storage device). In particular, the data structure may include a set of data, a relationship between data, and a function or a command applicable to data. Through the effectively designed data structure, the computing device may perform a calculation while minimally using resources of the computing device. In particular, the computing device may improve efficiency of calculation, reading, insertion, deletion, comparison, exchange, and search through the effectively designed data structure.

The data structure may be divided into a linear data structure and a non-linear data structure according to the form of the data structure. The linear data structure may be the structure in which only one data is connected after one data. The linear data structure may include a list, a stack, a queue, and a deque. The list may mean a series of dataset in which order exists internally. The list may include a linked list. The linked list may have a data structure in which data is connected in a method in which each data has a pointer and is linked in a single line. In the linked list, the pointer may include information about the connection with the next or previous data. The linked list may be expressed as a single linked list, a double linked list, and a circular linked list according to the form. The stack may have a data listing structure with limited access to data. The stack may have a linear data structure that may process (for example, insert or delete) data only at one end of the data structure. The data stored in the stack may have a data structure (Last In First Out, LIFO) in which the later the data enters, the sooner the data comes out. The queue is a data listing structure with limited access to data, and may have a data structure (First In First Out, FIFO) in which the later the data is stored, the later the data comes out, unlike the stack. The deque may have a data structure that may process data at both ends of the data structure.

The non-linear data structure may be the structure in which the plurality of data is connected after one data. The non-linear data structure may include a graph data structure. The graph data structure may be defined with a vertex and an edge, and the edge may include a line connecting two different vertexes. The graph data structure may include a tree data structure. The tree data structure may be the data structure in which a path connecting two different vertexes among the plurality of vertexes included in the tree is one. That is, the tree data structure may be the data structure in which a loop is not formed in the graph data structure.

Throughout the present specification, a calculation model, a nerve network, the network function, and the neural network may be used with the same meaning. Hereinafter, the terms of the calculation model, the nerve network, the network function, and the neural network are unified and described with a neural network. The data structure may include a neural network. Further, the data structure including the neural network may be stored in a computer readable medium. The data structure including the neural network may also include preprocessed data for processing by the neural network, data input to the neural network, a weight of the neural network, a hyper-parameter of the neural network, data obtained from the neural network, an active function associated with each node or layer of the neural network, and a loss function for training of the neural network. The data structure including the neural network may include predetermined configuration elements among the disclosed configurations. That is, the data structure including the neural network may include the entirety or a predetermined combination of pre-processed data for processing by neural network, data input to the neural network, a weight of the neural network, a hyper parameter of the neural network, data obtained from the neural network, an active function associated with each node or layer of the neural network, and a loss function for training the neural network. In addition to the foregoing configurations, the data structure including the neural network may include predetermined other information determining a characteristic of the neural network. Further, the data structure may include all type of data used or generated in a computation process of the neural network, and is not limited to the foregoing matter. The computer readable medium may include a computer readable recording medium and/or a computer readable transmission medium. The neural network may be formed of a set of interconnected calculation units which are generally referred to as "nodes". The "nodes" may also be called "neurons." The neural network consists of one or more nodes.

The data structure may include data input to the neural network. The data structure including the data input to the neural network may be stored in the computer readable medium. The data input to the neural network may include training data input in the training process of the neural network and/or input data input to the training completed neural network. The data input to the neural network may include data that has undergone pre-processing and/or data to be pre-processed. The pre-processing may include a data processing process for inputting data to the neural network. Accordingly, the data structure may include data to be pre-processed and data generated by the pre-processing. The foregoing data structure is merely an example, and the present disclosure is not limited thereto.

The data structure may include a weight of the neural network (in the present specification, weights and parameters may be used with the same meaning), Further, the data structure including the weight of the neural network may be stored in the computer readable medium. The neural network may include a plurality of weights. The weight is variable, and in order for the neural network to perform a desired function, the weight may be varied by a user or an algorithm. For example, when one or more input nodes are connected to one output node by links, respectively, the output node may determine a data value output from the output node based on values input to the input nodes connected to the output node and the weight set in the link corresponding to each of the input nodes. The foregoing data structure is merely an example, and the present disclosure is not limited thereto.

For a non-limited example, the weight may include a weight varied in the neural network training process and/or the weight when the training of the neural network is completed. The weight varied in the neural network training process may include a weight at a time at which a training cycle starts and/or a weight varied during a training cycle. The weight when the training of the neural network is completed may include a weight of the neural network completing the training cycle. Accordingly, the data structure including the weight of the neural network may include the data structure including the weight varied in the neural network training process and/or the weight when the training of the neural network is completed. Accordingly, it is assumed that the weight and/or a combination of the respective weights are included in the data structure including the weight of the neural network. The foregoing data structure is merely an example, and the present disclosure is not limited thereto.

The data structure including the weight of the neural network may be stored in the computer readable storage medium (for example, a memory and a hard disk) after undergoing a serialization process. The serialization may be the process of storing the data structure in the same or different computing devices and converting the data structure into a form that may be reconstructed and used later. The computing device may serialize the data structure and transceive the data through a network. The serialized data structure including the weight of the neural network may be reconstructed in the same or different computing devices through deserialization. The data structure including the weight of the neural network is not limited to the serialization. Further, the data structure including the weight of the neural network may include a data structure (for example, in the non-linear data structure, B-Tree, Trie, m-way search tree, AVL tree, and Red-Black Tree) for improving efficiency of the calculation while minimally using the resources of the computing device. The foregoing matter is merely an example, and the present disclosure is not limited thereto.

The data structure may include a hyper-parameter of the neural network. The data structure including the hyper-parameter of the neural network may be stored in the computer readable medium. The hyper-parameter may be a variable varied by a user. The hyper-parameter may include, for example, a learning rate, a cost function, the number of times of repetition of the training cycle, weight initialization (for example, setting of a range of a weight value to be weight-initialized), and the number of hidden units (for example, the number of hidden layers and the number of nodes of the hidden layer). The foregoing data structure is merely an example, and the present disclosure is not limited thereto.

Figure 21:
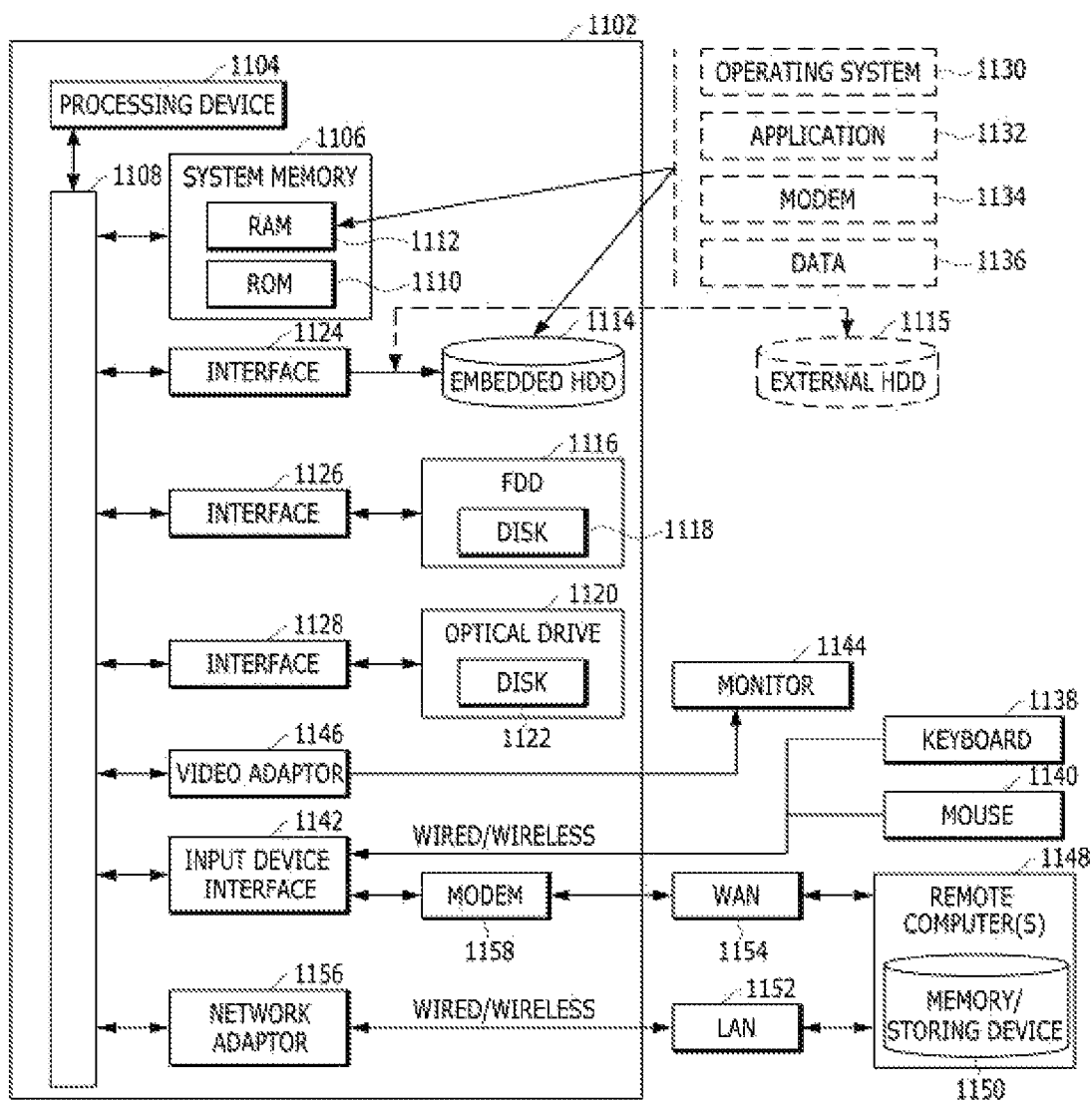
FIG. 21 is a conceptual diagram of a computing environment according to the exemplary embodiment of the present disclosure.

FIG. 21 is a simple and general schematic diagram illustrating an example of a computing environment in which the embodiments of the present disclosure are implementable.

The present disclosure has been described as being generally implementable by the computing device, but those skilled in the art will appreciate well that the present disclosure is combined with computer executable commands and/or other program modules executable in one or more computers and/or be implemented by a combination of hardware and software.

In general, a program module includes a routine, a program, a component, a data structure, and the like performing a specific task or implementing a specific abstract data form. Further, those skilled in the art will well appreciate that the method of the present disclosure may be carried out by a personal computer, a hand-held computing device, a microprocessor-based or programmable home appliance (each of which may be connected with one or more relevant devices and be operated), and other computer system configurations, as well as a single-processor or multiprocessor computer system, a mini computer, and a main frame computer.

The embodiments of the present disclosure may be carried out in a distribution computing environment, in which certain tasks are performed by remote processing devices connected through a communication network. In the distribution computing environment, a program module may be located in both a local memory storage device and a remote memory storage device.

The computer generally includes various computer readable media. The computer accessible medium may be any type of computer readable medium, and the computer readable medium includes volatile and non-volatile media, transitory and non-transitory media, and portable and non-portable media. As a non-limited example, the computer readable medium may include a computer readable storage medium and a computer readable transport medium. The computer readable storage medium includes volatile and non-volatile media, transitory and non-transitory media, and portable and non-portable media constructed by a predetermined method or technology, which stores information, such as a computer readable command, a data structure, a program module, or other data. The computer readable storage medium includes a RAM, a Read Only Memory (ROM), an Electrically Erasable and Programmable ROM (EEPROM), a flash memory, or other memory technologies, a Compact Disc (CD)-ROM, a Digital Video Disk (DVD), or other optical disk storage devices, a magnetic cassette, a magnetic tape, a magnetic disk storage device, or other magnetic storage device, or other predetermined media, which are accessible by a computer and are used for storing desired information, but is not limited thereto.

The computer readable transport medium generally implements a computer readable command, a data structure, a program module, or other data in a modulated data signal, such as a carrier wave or other transport mechanisms, and includes all of the information transport media. The modulated data signal means a signal, of which one or more of the characteristics are set or changed so as to encode information within the signal. As a non-limited example, the computer readable transport medium includes a wired medium, such as a wired network or a direct-wired connection, and a wireless medium, such as sound, Radio Frequency (RF), infrared rays, and other wireless media. A combination of the predetermined media among the foregoing media is also included in a range of the computer readable transport medium.

An illustrative environment 1100 including a computer 1102 and implementing several aspects of the present disclosure is illustrated, and the computer 1102 includes a processing device 1104, a system memory 1106, and a system bus 1108. The system bus 1108 connects system components including the system memory 1106 (not limited) to the processing device 1104. The processing device 1104 may be a predetermined processor among various commonly used processors. A dual processor and other multiprocessor architectures may also be used as the processing device 1104.

The system bus 1108 may be a predetermined one among several types of bus structure, which may be additionally connectable to a local bus using a predetermined one among a memory bus, a peripheral device bus, and various common bus architectures. The system memory 1106 includes a ROM 1110, and a RAM 1112. A basic input/output system (BIOS) is stored in a non-volatile memory 1110, such as a ROM, an EPROM, and an EEPROM, and the BIOS includes a basic routing helping a transport of information among the constituent elements within the computer 1102 at a time, such as starting. The RAM 1112 may also include a high-rate RAM, such as a static RAM, for caching data.

The computer 1102 also includes an embedded hard disk drive (HDD) 1114 (for example, enhanced integrated drive electronics (EIDE) and serial advanced technology attachment (SATA))—the embedded HDD 1114 being configured for exterior mounted usage within a proper chassis (not illustrated)—a magnetic floppy disk drive (FDD) 1116 (for example, which is for reading data from a portable diskette 1118 or recording data in the portable diskette 1118), and an optical disk drive 1120 (for example, which is for reading a CD-ROM disk 1122, or reading data from other high-capacity optical media, such as a DVD, or recording data in the high-capacity optical media). A hard disk drive 1114, a magnetic disk drive 1116, and an optical disk drive 1120 may be connected to a system bus 1108 by a hard disk drive interface 1124, a magnetic disk drive interface 1126, and an optical drive interface 1128, respectively. An interface 1124 for implementing an outer mounted drive includes, for example, at least one of or both a universal serial bus (USB) and the Institute of Electrical and Electronics Engineers (IEEE) 1394 interface technology.

The drives and the computer readable media associated with the drives provide non-volatile storage of data, data structures, computer executable commands, and the like. In the case of the computer 1102, the drive and the medium correspond to the storage of random data in an appropriate digital form. In the description of the computer readable media, the HDD, the portable magnetic disk, and the portable optical media, such as a CD, or a DVD, are mentioned, but those skilled in the art will well appreciate that other types of computer readable media, such as a zip drive, a magnetic cassette, a flash memory card, and a cartridge, may also be used in the illustrative operation environment, and the predetermined medium may include computer executable commands for performing the methods of the present disclosure.

A plurality of program modules including an operation system 1130, one or more application programs 1132, other program modules 1134, and program data 1136 may be stored in the drive and the RAM 1112. An entirety or a part of the operation system, the application, the module, and/or data may also be cached in the RAM 1112. It will be well appreciated that the present disclosure may be implemented by several commercially usable operation systems or a combination of operation systems.

A user may input a command and information to the computer 1102 through one or more wired/wireless input devices, for example, a keyboard 1138 and a pointing device, such as a mouse 1140. Other input devices (not illustrated) may be a microphone, an IR remote controller, a joystick, a game pad, a stylus pen, a touch screen, and the like. The foregoing and other input devices are frequently connected to the processing device 1104 through an input device interface 1142 connected to the system bus 1108, but may be connected by other interfaces, such as a parallel port, an IEEE 1394 serial port, a game port, a USB port, an IR interface, and other interfaces.

A monitor 1144 or other types of display devices are also connected to the system bus 1108 through an interface, such as a video adaptor 1146. In addition to the monitor 1144, the computer generally includes other peripheral output devices (not illustrated), such as a speaker and a printer.

The computer 1102 may be operated in a networked environment by using a logical connection to one or more remote computers, such as remote computer(s) 1148, through wired and/or wireless communication. The remote computer(s) 1148 may be a work station, a computing device computer, a router, a personal computer, a portable computer, a microprocessor-based entertainment device, a peer device, and other general network nodes, and generally includes some or an entirety of the constituent elements described for the computer 1102, but only a memory storage device 1150 is illustrated for simplicity. The illustrated logical connection includes a wired/wireless connection to a local area network (LAN) 1152 and/or a larger network, for example, a wide area network (WAN) 1154. The LAN and WAN networking environments are general in an office and a company, and make an enterprise-wide computer network, such as an Intranet, easy, and all of the LAN and WAN networking environments may be connected to a worldwide computer network, for example, the Internet.

When the computer 1102 is used in the LAN networking environment, the computer 1102 is connected to the local network 1152 through a wired and/or wireless communication network interface or an adaptor 1156. The adaptor 1156 may make wired or wireless communication to the LAN 1152 easy, and the LAN 1152 also includes a wireless access point installed therein for the communication with the wireless adaptor 1156. When the computer 1102 is used in the WAN networking environment, the computer 1102 may include a modem 1158, is connected to a communication computing device on a WAN 1154, or includes other means setting communication through the WAN 1154 via the Internet. The modem 1158, which may be an embedded or outer-mounted and wired or wireless device, is connected to the system bus 1108 through a serial port interface 1142. In the networked environment, the program modules described for the computer 1102 or some of the program modules may be stored in a remote memory/storage device 1150. The illustrated network connection is illustrative, and those skilled in the art will appreciate well that other means setting a communication link between the computers may be used.

The computer 1102 performs an operation of communicating with a predetermined wireless device or entity, for example, a printer, a scanner, a desktop and/or portable computer, a portable data assistant (PDA), a communication satellite, predetermined equipment or place related to a wirelessly detectable tag, and a telephone, which is disposed by wireless communication and is operated. The operation includes a wireless fidelity (Wi-Fi) and Bluetooth wireless technology at least. Accordingly, the communication may have a pre-defined structure, such as a network in the related art, or may be simply ad hoc communication between at least two devices.

The Wi-Fi enables a connection to the Internet and the like even without a wire. The Wi-Fi is a wireless technology, such as a cellular phone, which enables the device, for example, the computer, to transmit and receive data indoors and outdoors, that is, in any place within a communication range of a base station. A Wi-Fi network uses a wireless technology, which is called IEEE 802.11 (a, b, g, etc.) for providing a safe, reliable, and high-rate wireless connection. The Wi-Fi may be used for connecting the computer to the computer, the Internet, and the wired network (IEEE 802.3 or Ethernet is used). The Wi-Fi network may be operated at, for example, a data rate of 11 Mbps (802.11a) or 54 Mbps (802.11b) in an unauthorized 2.4 and 5 GHz wireless band, or may be operated in a product including both bands (dual bands).

Those skilled in the art may appreciate that information and signals may be expressed by using predetermined various different technologies and techniques. For example, data, indications, commands, information, signals, bits, symbols, and chips referable in the foregoing description may be expressed with voltages, currents, electromagnetic waves, magnetic fields or particles, optical fields or particles, or a predetermined combination thereof.

Those skilled in the art will appreciate that the various illustrative logical blocks, modules, processors, means, circuits, and algorithm operations described in relationship to the embodiments disclosed herein may be implemented by electronic hardware (for convenience, called "software" herein), various forms of program or design code, or a combination thereof. In order to clearly describe compatibility of the hardware and the software, various illustrative components, blocks, modules, circuits, and operations are generally illustrated above in relation to the functions of the hardware and the software. Whether the function is implemented as hardware or software depends on design limits given to a specific application or an entire system. Those skilled in the art may perform the function described by various schemes for each specific application, but it shall not be construed that the determinations of the performance depart from the scope of the present disclosure.

Various embodiments presented herein may be implemented by a method, a device, or a manufactured article using a standard programming and/or engineering technology. A term "manufactured article" includes a computer program, a carrier, or a medium accessible from a predetermined computer-readable storage device. For example, the computer-readable storage medium includes a magnetic storage device (for example, a hard disk, a floppy disk, and a magnetic strip), an optical disk (for example, a CD and a DVD), a smart card, and a flash memory device (for example, an EEPROM, a card, a stick, and a key drive), but is not limited thereto. Further, various storage media presented herein include one or more devices and/or other machine-readable media for storing information.

It shall be understood that a specific order or a hierarchical structure of the operations included in the presented processes is an example of illustrative accesses. It shall be understood that a specific order or a hierarchical structure of the operations included in the processes may be rearranged within the scope of the present disclosure based on design priorities. The accompanying method claims provide various operations of elements in a sample order, but it does not mean that the claims are limited to the presented specific order or hierarchical structure.

The description of the presented embodiments is provided so as for those skilled in the art to use or carry out the present disclosure. Various modifications of the embodiments may be apparent to those skilled in the art, and general principles defined herein may be applied to other embodiments without departing from the scope of the present disclosure. Accordingly, the present disclosure is not limited to the embodiments suggested herein, and shall be interpreted within the broadest meaning range consistent to the principles and new characteristics presented herein.

What is claimed is:

1. An artificial intelligence-based semiconductor design method performed by a computing device including at least one processor, the artificial intelligence-based semiconductor design method comprising:
   inputting state map information related to a connection relationship between semiconductor devices to a Convolutional Neural Network (CNN) of a semiconductor placement model;
   placing the semiconductor device based on an output of the convolutional neural network; and
   training the semiconductor placement model based on the placement of the semiconductor devices,
   wherein the state map information includes a connection map representing a connection relationship between semiconductor devices placed on a canvas, and
   the connection map is generated based on:
   generating an adjacency matrix expressing adjacency between the semiconductor devices based on a connection relationship between the semiconductor devices;
   performing normalization on values of the adjacency matrix; and
   generating the connection map based on the normalized adjacency matrix.

2. The artificial intelligence-based semiconductor design method of claim 1, wherein the connection map expresses a connection relationship between the semiconductor device to be placed and the semiconductor devices already placed.

3. The artificial intelligence-based semiconductor design method of claim 1, wherein the state map information further includes:
   a density map representing densities between semiconductor devices placed in a unit area; and
   a congestion map representing congestion of the semiconductor devices placed on the canvas.

4. The artificial intelligence-based semiconductor design method of claim 3, wherein the state map information further includes a feature map expressing features of semiconductor devices, and
   feature information of the semiconductor devices includes at least one of:
   size information including at least one of a width or a height of the semiconductor device; or
   type information indicating whether the semiconductor device is a macro cell.

5. The artificial intelligence-based semiconductor design method of claim 1, wherein the training of the semiconductor placement model includes:
   performing an action of placing the semiconductor device on a canvas based on a state related to an output of the convolutional neural network through the semiconductor placement model;
   estimating a reward for the action; and
   returning the reward to the semiconductor placement model and performing reinforcement learning on the semiconductor placement model.

6. The artificial intelligence-based semiconductor design method of claim 3, wherein the congestion map is generated based on an action of calculating a ratio of second routing resources representing required resources for connecting the semiconductor devices placed on the canvas with wires to first routing resources representing supply resources to which wires are allocatable for each area of the canvas.

7. A computer program stored in a non-transitory computer readable storage medium, wherein when the computer program is executed by one or more processors, the computer program performs following operations for automating an artificial intelligence-based semiconductor design, the operations comprising:
   inputting state map information related to a connection relationship between semiconductor devices to a Convolutional Neural Network (CNN) of a semiconductor placement model;
   placing the semiconductor device based on an output of the convolutional neural network; and
   training the semiconductor placement model based on the placement of the semiconductor devices, wherein the state map information includes a connection map representing a connection relationship between semiconductor devices placed on a canvas, and the connection map is generated based on:

generating an adjacency matrix expressing adjacency between the semiconductor devices based on a connection relationship between the semiconductor devices;

performing normalization on values of the adjacency matrix; and generating the connection map based on the normalized adjacency matrix.

8. A computing device for automating an artificial intelligence-based semiconductor design, the computing device comprising:

a processor including at least one core; and a memory including program codes executed in the processor; and a network unit for receiving state map information related to a connection relationship of semiconductor devices, wherein the processor is configured to input the state map information to a Convolutional Neural Network (CNN) of a semiconductor placement model, and place the semiconductor device based on an output of the convolutional neural network, and train the semiconductor placement model based on the placement of the semiconductor devices, and the state map information includes a connection map representing a connection relationship between semiconductor devices placed on a canvas, and the connection map is generated based on:

generating an adjacency matrix expressing adjacency between the semiconductor devices based on a connection relationship between the semiconductor devices;

performing normalization on values of the adjacency matrix; and generating the connection map based on the normalized adjacency matrix.

\* \* \* \* \*